(12) United States Patent
Melbert et al.

(10) Patent No.: US 7,046,051 B2
(45) Date of Patent: May 16, 2006

(54) METHOD AND DEVICE FOR SWITCHING ON AND OFF POWER SEMICONDUCTORS, ESPECIALLY FOR THE TORQUE-VARIABLE OPERATION OF AN ASYNCHRONOUS MACHINE, FOR OPERATING AN IGNITION SYSTEM FOR SPARK IGNITION ENGINES, AND SWITCHED-MODE POWER SUPPLY

(75) Inventors: Joachim Melbert, Deisenhofen (DE); Christoph Dörlemann, RecklingHausen (DE)

(73) Assignee: Rubitec Gesellshaft fur Innovation und Technologie der Ruhr-UniversitatBochum mbH., Bochum (DE)

( * ) Notice: Subject to any disclaimer, the term of this patent is extended or adjusted under 35 U.S.C. 154(b) by 441 days.

(21) Appl. No.: 10/455,252

(22) Filed: Jun. 5, 2003

(65) Prior Publication Data

US 2004/0085117 A1    May 6, 2004

Related U.S. Application Data

(63) Continuation of application No. PCT/EP01/14226, filed on Dec. 5, 2001.

(30) Foreign Application Priority Data

Dec. 6, 2000  (DE)  ............................... 100 61 563

(51) Int. Cl.
    *H03K 3/00* (2006.01)
(52) U.S. Cl. ...................... 327/110; 327/374
(58) Field of Classification Search ............... 327/108, 327/110, 365, 374, 375, 376, 377, 379, 380, 327/381, 382, 383, 387, 389
    See application file for complete search history.

(56) References Cited

U.S. PATENT DOCUMENTS

| 4,645,986 | A | | 2/1987 | Melbert et al. ............. 315/387 |
|---|---|---|---|---|
| 5,390,070 | A | | 2/1995 | Niedermeier ............... 361/152 |
| 5,576,648 | A | * | 11/1996 | Rossi et al. ................. 327/110 |
| 5,877,646 | A | | 3/1999 | Jörg ........................... 327/374 |
| 5,926,012 | A | | 7/1999 | Takizawa et al. ........... 323/284 |
| 6,348,819 | B1 | * | 2/2002 | Ten Pierick et al. ........ 327/110 |

FOREIGN PATENT DOCUMENTS

| DE | 3420312 C2 | 12/1985 |
|---|---|---|
| DE | 19610895 A1 | 9/1997 |

(Continued)

OTHER PUBLICATIONS

*Non-Problematic Gate Drive Of IGBT-Modules*, Bösterling et al., Power Conversion, Apr. 1992 Proceedings, pp. 87-95.

(Continued)

*Primary Examiner*—Jeffrey Zweizig
(74) *Attorney, Agent, or Firm*—Henneman & Saunders; Larry E. Henneman, Jr.

(57) ABSTRACT

A method and device for switching power semi-conductors on and off, especially for IGBTs and MOS-FETs with inductive loads, and how they would be employed with torque-variable asynchronous machines, in ignition systems for spark ignition engines, in switch mode power supplies and power factor controllers. During a switching operation of the power semiconductor, a voltage across the semiconductor and the current through the semiconductor are measured, a time function of the voltage as well as a time function of the current are controlled, and the control of the voltage time function and the control of the current time function are effected essentially one after the other.

62 Claims, 18 Drawing Sheets

FOREIGN PATENT DOCUMENTS

| EP | 0493185 A | 7/1992 |
| EP | 0874461 A2 | 10/1998 |
| FR | 2789820 A1 | 8/2000 |
| GB | 2318467 A | 4/1998 |
| WO | WO 00/27032 | 5/2000 |

OTHER PUBLICATIONS

*PFC Controllers Optimised For Functional Requirements*, James Noon, PCIM Europe, No. 4; pp. 22-25.

*Reihenschaltung von Leistungshalbleitem mit steuerseitig geregelter Spannungsverteilung*, Doctorial thesis by Christian Gerster, "Series in Microelectronics", 1995, vol. 50, pp. 58-73, German text.

*Dynamic Gate Controller(DGC)—A New IGBT gate Unit for High Current/High Voltage IGBT Modules*, Rüedi et al., Power Conversion, Jun. 1995 Proceedings, pp. 241-249.

*Damit es richtig zündet*, Lokuta et al., Design & Elektronik, No. 25/26, Dec. 10, 1996, pp. 52-54, German text.

*Neue lötbare Sixpacks der IGBT Plus—Serie Econo Plus*, Technische Information, Toshiba Co., Jun. 1998, German and English text.

*Floating, Flexible And Intelligent Gate Driver Circuit For IGBT Half-Bridge Modules Up To 1200V, 100A*, Edelmoser et al., Power Conversion, Apr. 1992 Proceedings, pp. 96-106.

*Netzschwankungen korrigieren*, James Noon, Leistungselektronik & Stromversorgung, Apr. 2000, pp. 40-43, German text.

*Controller Combines 'Green' Mode With PFC And PWM*, Goddard, Power Electronics Engineering Europe, Jun. 1999, pp. 12-16.

*BiCMOS PFC/PWM Combination Controller*; Unitrode Co., SLUS419, Aug. 1999.

*A New Adaptive Driving Technique for High Current Gate Controlled Devices*, Musumeci et al., IEEE Transactions, pp. 480-486, 1994.

*Assessment of Off-State Negative Gate Voltage Requirements for IGBT's*, McNeill et al., IEEE Transactions On Power Electronics, vol. 13; pp. 436-440, 1998.

*Specification Notice LT1533*, Linear Technology Corporation, Jan. 1999, 21 pages.

\* cited by examiner

US 7,046,051 B2

METHOD AND DEVICE FOR SWITCHING ON AND OFF POWER SEMICONDUCTORS, ESPECIALLY FOR THE TORQUE-VARIABLE OPERATION OF AN ASYNCHRONOUS MACHINE, FOR OPERATING AN IGNITION SYSTEM FOR SPARK IGNITION ENGINES, AND SWITCHED-MODE POWER SUPPLY

RELATED APPLICATIONS

This application claims the right of priority under 35 U.S.C. §120, as authorized by 35 U.S.C. §365(c) to International Application No. PCT/EP01/14226 filed on Dec. 5, 2001 by the same inventors (published under PCT Article 21(2) in German and not English), which claims priority to Application No. 100 61 563.5 filed in Germany on Dec. 6, 2000, both of which are incorporated herein by reference in their entirety.

FIELD OF THE INVENTION

The present invention relates to the field of switching power semiconductors. More specifically, the invention is related to methods and apparatuses for switching power semiconductors, in particular power transistors, insulated gate bipolar transistors (IGBTs) and metal oxide field effect transistors (MOS-FETs).

The present invention is preferably used for controlling electric induction motors at variable speeds, for operating ignition circuits in internal combustion engines, and for operating switched-mode power supplies and power-factor-controllers.

BACKGROUND OF THE INVENTION

It is well-known in the art to use power semiconductors of the type specified above for various control purposes, as described in an article by Rüedi, Heinz et al. "Dynamic Gate Controller—A new IGBT gate unit for high current/high voltage IGBT modules", Power Conversion, June 1995 Proceedings, pages 241 through 249. A method for operating an ignition system and a corresponding ignition circuit is described in an article of Lokuta, Fred et al. "Damit es richtig zündet", Design & Elektronik, No. 25/26 of Dec. 10, 1996, pages 52 through 54.

A switch-mode power supply of the above-mentioned kind is described in the data sheet "LT1533" from the Linear Technology Company of January 1999.

Power-factor-controllers (PFCs) are well-known in the art in various configurations, for example from an article by Noon, James, "PFC controllers optimised for functional requirements", PCIM Europe, No. 4, 2000, pages 22 through 25, from another article by the same author "Netzschwankungen korrigieren", Leistungselektronik & Stromversorgung, April 2000, pages 40 through 43, from an article by Goddard, Thomas, "Controller combines 'Green' mode with PFC and PWM", Power Electronics Engineering Europe, June 1999, pages 12 through 16, as well as from a data sheet "BiMOS PFC/PWM Combination Controller" from the UNITRODE Company of August 1999.

IGBTs and power MOS-FETs are conventional semiconductor components which are distributed from various suppliers, either as single elements or as modules combining a plurality of such IGBTs (cf. data sheet "Neue lötbare Six-packs der IGBT Plus-Serie Econo Plus" from the Toshiba Company of June 1998).

As already mentioned, such IGBTs and MOS-FETs are typically used for switched-mode power supplies, power-factor-controllers, ignition systems for internal combustion engines and for inverters controlling electrical motors.

For controlling such power semiconductors various driver circuits have been proposed.

German disclosure document DE 34 20 312 C2 discloses a control circuit for a deflection power transistor as used in a deflection circuit of a television set. The control circuit is provided with a sensor arrangement providing an actual signal being proportional to the instantaneous value of the transistor main current. The actual value signal is fed to the control circuit in order to control the switching-on base current to a predetermined value during its entire rise and as a function of the actual value signal.

In a doctoral thesis by Gerster, Christian "Reihenschaltung von Leistungshalbleitern mit steuerseitig geregelter Spannungsverteilung", published in "Series in Microelectronics", Vol. 50, Hartung-Gorre Verlag Konstanz, 1995, various methods for controlling the switching behavior of series-connected power semiconductors, for example IGBTs, are described. In this connection reference is made to so-called "Snubber"-circuits, being essentially circuits for limiting a voltage rise.

Further driver circuits for IGBTs are disclosed in articles by Edelmoser, K. H. et al. "Floating, flexible and intelligent gate driver circuit for IGBT half-bridge modules up to 1,200 V, 100 A", Power Conversion, April 1992 Proceedings, pages 96 through 106, as well as in an article by Bösterling, Werner et al., "Nonproblematic gate drive of IGBT-modules", Power Conversion, April 1992 Proceedings, pages 87 through 95.

As already mentioned above, IGBTs are today conventionally used in electrical inverters. They generate a frequency variable 3-phase voltage from a DC voltage for operating electrical motors at variable speeds, in particular induction motors, being also designated as "asynchronous motors". In contrast to thyristors, having been used in earlier times, IGBT transistors may be switched on and off at their gate at any desired moment in time.

In order to effect a switching-on and a switching-off of the IGBTs in a timely controlled manner, the inverters comprise a microcontroller or a control unit. The output signals of these circuits are at 0/5 V or at −5 V/15 V and, therefore, below the control level of commercial IGBTs being at 0/15 V. Further, the output current of these circuits is too low in order to effect a direct coupling to the IGBTs. For these reasons, it is necessary to use a drive circuit. Drive circuits of a type being of interest for the present application generally have a very low impedance output and, therefore, may supply high output currents of the order of several amps. In such a way, commercial IGBT transistors for the above-mentioned applications may be brought into the operational states "ON" and "OFF".

In order to effect the afore-mentioned switching operations as quickly as possible, the edge steepness of the collector emitter voltage $U_{CE}$ and for the collector current $I_C$ should be as high as possible. With short switching-over times low switching-over losses are obtained. On the other hand, the edge steepness of the two afore-mentioned variable quantities may not be selected too high, because in practice there exist limiting side conditions. For example, the variation of the collector-emitter voltage vs. time $dU_{CE}/dt$ must be limited because otherwise inadmissibly high displacement currents appear within the isolation of the motor. The time variation $dU_{CE}/dt$ of the collector-emitter voltage as well as time variation of the collector current $dI_C/dt$ must also be limited because otherwise inadmissibly high electromagnetic radiation occurs. Finally, a too high time variation $dI_C/dt$ of the collector current in connection with the parasitic inductance could cause an excess voltage at the IGBT.

For these reasons the edge steepness or the time function, respectively, of $dU_{CE}/dt$ and $dI_C/dt$ must be held low. On the other hand, this is the phase in which switching losses occur, which, in turn, determine the dissipated heat within the IGBT and, hence, shall also be small.

Prior art drive circuits use passive networks between the driver output and the IGBT gate and the given parameters are tuned to one another. In the above-mentioned article by Bösterling et al. two different approaches are described, one of which (FIG. 5a on page 91) suggesting a fixed resistor within the gate circuit of the IGBT, whereas the other approach (FIG. 6b on page 91) suggests to control the gate of the IGBT via two distinct resistors, each of which being adapted to be switched into the gate circuit via a transistor. Whereas, therefore, in the first mentioned approach one and the same resistor is provided for the switching-on process and for the switching-off process, the second approach utilizes two distinct resistances, wherein the resistor for the switching-off process is generally dimensioned smaller as compared to the resistor for the switching-on process.

This concept, however, has the disadvantage that the resistor or the resistors, respectively, may only be dimensioned according to the power semiconductor data sheet, wherein changes in the operational conditions (e.g. varying temperature), as well as in particular variations in the load may result in partially drastical deteriorations of the operational performance.

The article by McNeill, Neville et al. "Assessment of Off-State Negative Gate Voltage requirements for IGBTs", IEEE Transactions On Power Electronics, Vol. 13, pages 436 through 440, 1998, comprises a general report about a potential parasitic switching-on of the switched-off IGBT due to a feedback capacity, when the first derivative of the collector-emitter voltage assumes positive values.

An article by Musumeci, S. et al. "A New Adaptive Driving Technique for High Current Gate Controlled Devices", IEEE Transactions, pages 480 through 486, 1994, discloses a circuit attempting to limit the first derivative of the collector current, in order to limit EMV interferences. For that purpose two switchable voltage sources are used. A close-loop control is not provided.

The prior art drive circuits, therefore, have various disadvantages:

With a fixedly dimensioned passive network it is only possible to determine a function $U_{CE}(t)$ or $I_C(t)$ for one specific load. The respective other function $I_C(t)$ or $U_{CE}(t)$ follows automatically therefrom. Depending on the particular load of the circuit, the two time functions will vary. Moreover, the two functions are approximately highly non-linear and do not show a constant $dU_{CE}/dt$ and $dI_C/dt$ which, however, would be desirable due to the load on the isolation and the electromagnetic radiation.

Furthermore, the edge steepnesses or the time functions $dU_{CE}/dt$ and $dI_C/dt$, respectively, may not be set independently one from another. By means of appropriate networks, however, they may be set differently for the switching-on process and for the switching-off process.

With standard dimensioning of conventional drive networks about 25% to 30% excess voltage appears at the collector-emitter voltage $U_{CE}$ during the switching-off, as compared with the supply voltage. This generally requires a higher voltage class of the IGBT and, therefore, additional costs.

Another disadvantage of prior art drive circuits consists in that the maximum values of $dU_{CE}/dt$ and $dI_C/dt$ only appear over a short period of time during the switching process. Considering that the dimensioning is made depending on these threshold values, a higher dissipated power results, as compared with a switching at constant $dU_{CE}/dt$ and $dI_C/dt$.

Finally, conventional drive circuits have the disadvantage that certain components determining the transient behavior are partially located ahead of the gate and partially at the IGBT output. These components are, therefore, exposed to high voltage. This results in high currents, and, therefore, power components at additional costs are required.

The article by Rüedi "Dynamic Gate Controller . . . ", mentioned at the outset, discloses a topology for an IGBT. A drive circuit comprises a controller for the time function of the collector-emitter voltage $U_{CE}$ as well as the time function of the collector current $I_C$ and, finally, a monitoring circuit for the collector-emitter voltage $U_{CE}$. The signals generated by these modules are combined in a sum node and are used for controlling the IGBT gate. Nothing is disclosed about the exact design, function and cooperation of these modules. The article, further, comprises no evidence about the effectivity of the disclosed method, for example by means of current-voltage curves.

German disclosure document DE 196 10 895 A1 discloses a method for controlling the switching-on process of an IGBT as well as an apparatus for carrying out said method. Although a network is used at the input of the IGBT, the network being designated as a current source, the network is functionally converted into a voltage source by feeding back the input of the network to the inverting input of an output stage (operational amplifier) being arranged ahead of the network. This prior art method also starts from predetermined parameters (characteristic curves) of the IGBT, and the collector current is not measured. As a consequence, the disclosed control is again only valid for one specific point of operation of the IGBT and does not take into account variations in ambient or load conditions.

U.S. Pat. No. 5,390,070 discloses a gated power output stage for inductive loads. The output stage comprises a power semiconductor, wherein both the switched current and the voltage across the power semiconductor are individually detected. From the detected time functions the first derivative is derived wherein the current signal is inverted prior to generating the first derivative. In a sum node the functions corresponding to the first derivatives are superimposed to the control square wave signal for the control electrode of the power semiconductor and the power semiconductor is controlled by means of that superimposed signal. By doing so the high rising and falling speeds, respectively, of the current signal and of the voltage signal shall be reduced.

This prior art power output stage allows an independent setting within the two control circuits of the current signal and the voltage signal, however, no close loop-control starting from a predetermined desired value is used, so that the current function on the one hand and the voltage function on the other hand may not be controlled individually.

Finally European patent specification 493 185 discloses a control circuit for a force commutated power transistor. This circuit corresponds essentially to the approach described in the above-mentioned article by Rüedi.

British disclosure document 2 318 467 A discloses a control circuit for a MOS-FET with inductive load. The circuit is provided with a cross-over switch enabling to connect the gate electrode of the MOS-FET with two different fixed resistors. According to the corresponding description the MOS-FET shall thus be controlled by a signal corresponding to the drain current flowing through the MOS-FET or, alternately, by a signal corresponding to the drain-source voltage across the MOS-FET. Further, it is indicated that both an open-loop control or a close-loop control might be used, however, there is no enabling disclosure how this could be done in practice because the given examples are inoperative and the associated description is incorrect.

U.S. Pat. No. 5,926,012 A discloses a circuit in which the first derivative of the collector current and the first derivative of the collector-emitter voltage of a transistor are detected. These variable quantities are each fed to a comparator which is also supplied with a reference value. The output of the comparators, hence, generate a logical signal "0" or "1", depending on whether the measured value is above or below the reference value. These digital output signals "0" or "1" are then fed to an open-loop control circuit (FIGS. 6 through 10).

International patent disclosure document WO 00/27032 A discloses a circuit in which certain constant currents are superimposed to the gate current of a MOS-FET. FIG. 3 shows four distinct switches for four distinct current sources by means of which the gate current may be increased or decreased. The switches are operated as a function of certain threshold values so that the gate current is varied stepwise. Therefore, no continuous close-loop control is provided.

It is, therefore, an object underlying the invention to improve a method and an apparatus of the type specified at the outset which avoids the afore-described disadvantages. In particular, the desired switching behavior of the IGBT shall be made possible with the use of components belonging to the lowest possible power class and, hence, the lowest possible costs, by individually controlling the time functions of the collector-emitter voltage $dU_{CE}/dt$ and the collector current $dI_C/dt$. Moreover, the electromagnetic radiation shall be limited to a minimum. Further, the excess voltage during the switching-off shall be reduced to a minimum, so that the admissible voltage range of the power transistor may be used to the widest possible extent. Finally, the overall dissipated power during a switching operation shall be substantially smaller as compared to conventional solutions. Moreover, it shall be possible to monolithically integrate the circuit. Finally, the control stability shall be improved.

SUMMARY OF THE INVENTION

The afore-mentioned and other objects of the invention are achieved by a method of switching power semiconductors wherein during a switching operation of the power semiconductor, a) a voltage ($U_{CE}$; $U_{DS}$) across said power semiconductor as well as a current ($I_C$; $I_D$) flowing through the power semiconductor are measured, b) a time function ($dU_{CE}/dt$; $dU_{DS}/dt$) of the voltage ($U_{CE}$; $U_{DS}$) as well as a time function ($dI_C/dt$; $dI_D/dt$) of the current ($I_C$; $I_D$) are controlled, and c) the control of the voltage time function ($dU_{CE}/dt$; $dU_{DS}/dt$) and the control of the current time function ($dI_C/dt$; $dI_D/dt$) are effected essentially one after the other, wherein, further, d) for controlling the voltage time function ($dU_{CE}/dt$; $dU_{DS}/dt$), a first signal ($I_{soll}$) corresponding to a desired value ($[dU_{CE}/dt]$; $[dU_{DS}/dt]$) of the voltage time function ($dU_{CE}/dt$; $dU_{DS}/dt$) and a second signal ($I_{ist}$) corresponding to an actual value ($dU_{CE}/dt$; $dU_{DS}/dt$) of the voltage time function ($dU_{CE}/dt$; $dU_{DS}/dt$) are generated, the first signal ($I_{soll}$) and the second signal ($I_{ist}$) are subtracted one from the other, a first difference signal ($I_{ist}-I_{soll}$) between the first and the second signals ($I_{ist}$, $I_{soll}$) is converted into a first control signal ($\Delta U_{dU}$), and e) for controlling the current time function ($dI_C/dt$; $dI_D/dt$), a third signal ($I_{soll}$) corresponding to a desired value ($[dI_C/dt]$; $[dI_D/dt]$) of the current time function ($dI_C/dt$; $dI_D/dt$) and a fourth signal ($I_{ist}$) corresponding to an actual value ($dI_C/dt$; $dI_D/dt$) of the current time function ($dI_C/dt$; $dI_D/dt$) are generated, the third signal ($I_{soll}$) and the fourth signal ($I_{ist}$) are subtracted one from the other, a second difference signal ($I_{ist}-I_{soll}$) between the third and the fourth signals ($I_{ist}$, $I_{soll}$) is converted into a second control signal ($\Delta I_{dI}$).

The objects are further achieved by a method of switching power semiconductors wherein during a switching operation of the power semiconductor, a) a voltage ($U_{CE}$; $U_{DS}$) across the power semiconductor as well as a current ($I_C$; $I_D$) flowing through the power semiconductor are measured, b) a voltage time function ($dU_{CE}/dt$; $dU_{DS}/dt$) as well as a current time function ($dI_C/dt$; $dI_D/dt$) are controlled, and c) the control of the voltage time function ($dU_{CE}/dt$; $dU_{DS}/dt$) and the control of said current time function ($dI_C/dt$; $dI_D/dt$) are effected essentially one after the other, wherein, further, d) for controlling the voltage time function ($dU_{CE}/dt$; $dU_{DS}/dt$), a first signal ($I_{soll}$) corresponding to a desired value ($[dU_{CE}/dt]$; $[dU_{DS}/dt]$) of the voltage time function ($dU_{CE}/dt$; $dU_{DS}/dt$) and a second signal ($I_{ist}$) corresponding to an actual value ($dU_{CE}/dt$; $dU_{DS}/dt$) of the voltage time function ($dU_{CE}/dt$; $dU_{DS}/dt$) are generated, the first signal ($I_{soll}$) and the second signal ($I_{ist}$) are subtracted one from the other, a first difference signal ($I_{ist}-I_{soll}$) between the first and the second signals ($I_{ist}$, $I_{soll}$) is compared with a first reference signal (0), and if the first difference signal ($I_{ist}-I_{soll}$) is above the first reference value (0), the first difference signal ($I_{ist}-I_{soll}$) is processed as a first control signal ($\Delta U_{dU}$), whereas if the first difference signal ($I_{ist}-I_{soll}$) is below the first reference signal (0), a zero signal is processed as the first control signal ($\Delta U_{dU}$), and e) for controlling the current time function ($dI_C/dt$; $dI_D/dt$), a third signal ($I_{soll}$) corresponding to a nominal value ($[dI_C/dt]$; $[dI_D/dt]$) of the current time function ($dI_C/dt$; $dI_D/dt$) and a fourth signal ($I_{ist}$) corresponding to an actual value ($dI_C/dt$; $dI_D/dt$) of the current time function ($dI_C/dt$; $dI_D/dt$) are generated, the third signal ($I_{soll}$) and the fourth signal ($I_{ist}$) are subtracted one from the other, a second difference signal ($I_{ist}$-$I_{soll}$) between the third and the fourth signals ($I_{ist}$, $I_{soll}$) is compared with a second reference signal (0), and if the second difference signal ($I_{ist}$-$I_{soll}$) is above the second reference value (0), the second difference signal ($I_{ist}$-$I_{soll}$) is processed as a second control signal ($\Delta I_{dI}$), whereas if the second difference signal ($I_{ist}$-$I_{soll}$) is below the second reference signal (0), a zero signal is processed as the second control signal ($\Delta I_{dI}$).

Moreover, the objects are achieved by an apparatus for switching power semiconductors comprising:

a) means for measuring a voltage ($U_{CE}$; $U_{DS}$) across the power semiconductor as well as a current ($I_C$; $I_D$) flowing through the power semiconductor, b) driver means for controlling a time function ($dU_{CE}/dt$; $dU_{DS}/dt$) of the voltage ($U_{CE}$; $U_{DS}$) as well as a time function ($dI_C/dt$; $dI_D/dt$) of the current ($I_C$; $I_D$), the controlling of the time functions ($dU_{CE}/dt$, $dI_C/dt$; $dU_{DS}/dt$, $dI_D/dt$) being effected one after the other, wherein the driver means comprises:

voltage time function ($dU_{CE}/dt$; $dU_{DS}/dt$) control means having means for generating a first signal ($I_{soll}$) corresponding to a desired value ([$dU_{CE}/dt$]; [$dU_{DS}/dt$]) of the voltage time function ($dU_{CE}/dt$; $dU_{DS}/dt$) and a second signal ($I_{ist}$) corresponding to an actual value ($dU_{CE}/dt$, $dU_{DS}/dt$) of the voltage time function ($dU_{CE}/dt$; $dU_{DS}/dt$), means for subtracting the first signal ($I_{soll}$) and the second signal ($I_{ist}$) one from the other, means for converting a first difference signal ($I_{ist}$-$I_{soll}$) between the first and the second signals ($I_{ist}$, $I_{soll}$) into a first control signal ($\Delta U_{dU}$), and current time function ($dI_C/dt$, $dI_D/dt$) control means having means for generating a third signal ($I_{soll}$) corresponding to a desired value ([$dI_C/dt$]; [$dI_D/dt$]) of the current time function ($dI_C/dt$; $dI_D/dt$) and a fourth signal ($I_{ist}$) corresponding to an actual value ($dI_C/dt$; $dI_D/dt$) of the current time function ($dI_C/dt$; $dI_D/dt$), means for subtracting the third signal ($I_{soll}$) and the fourth signal ($I_{ist}$) one from the other, means for converting a second difference signal ($I_{ist}$-$I_{soll}$) between the third and the fourth signals ($I_{ist}$, $I_{soll}$) into a second control signal ($\Delta I_{dI}$).

Moreover, the objects underlying the invention are likewise achieved by an induction motor, an ignition system, and a power factor controller, respectively, all of them having means for generating from a DC supply voltage a three-phase frequency variable voltage, or a gated output ignition voltage, or a DC output voltage, respectively, by switching power semiconductors, and comprising the measuring means and the driver means as mentioned before.

The objects underlying the invention are thus entirely achieved.

According to the invention the time functions $dU_{CE}/dt$ and $dI_C/dt$ are controlled independently from one another. A sequence control controls the entire switching-on process and the switching-off process and guarantees at any time (also in the event of a malfunction, for example in the event of a short circuit cut-off) that both controls are solely effective during the required period of time within the time functions and do never affect each other.

This control of the power semiconductors, therefore, achieves the desired EMV behavior as well as the desired protection of the isolation. Experiments have evidenced that the excess voltage during the switching-off process could be reduced to less than 5% so that it is possible to take fully advantage of the admissible voltage range of the power transistor, as already mentioned. Further, it could be confirmed that the dissipated power during the switching process is substantially smaller as compared with prior art solutions in which the same limit steepness had been set.

Within the scope of the present invention it is particularly preferred when transistors are used as power semiconductors, in particular insulated gate bipolar transistors (IGBTs). In that case the input voltage is the gate-emitter voltage $U_{GE}$, the output voltage is the collector-emitter voltage $U_{CE}$ and the output current is the collector current $I_C$.

In this case it is further preferred for control purposes to use the collector-emitter voltage $U_{CE}$ of the transistor as control voltage and the collector current $I_C$ of the transistor as the control current.

As an alternative, however, the power semiconductor may also be configured as a MOS-FET power semiconductor. In that case the input voltage is the gate-source voltage $U_{GS}$, the output voltage is the drain-source voltage $U_{DS}$ and the output current is the drain current $I_D$.

Accordingly, for control purposes the drain-source voltage $U_{DS}$ is used as the control voltage and the drain current $I_D$ of the MOS-FET as the control current.

If in the scope of the present invention the term "time function" of a voltage or of a current is used, this term shall preferably mean the first time derivative of the voltage function or of the current function, respectively. However, this is not to be understood as a liming feature. Instead, the invention allows to derive other variable quantities from the voltage and the current functions, for example the second time derivative, an integrated time function or the like.

For controlling the time function during switching-on and switching-off of the power semiconductor it is particularly preferred to control the current time function first and the voltage time function second during the switching-on of the power semiconductor.

Accordingly, when the power semiconductor is switched-off, the voltage time function is preferably controlled first and the current time function second.

These approaches take advantage of the fact that the afore-mentioned quantities for the voltage value and the current value, respectively, do significantly change during the afore-mentioned periods of time, and, hence, are particularly suitable for a separate control.

According to the invention, various criteria have been developed in order to effect a switching-over from the current time function to the voltage time function for a switching-on process of the power semiconductor and, for a switching-off of the power semiconductor to switch-over from the voltage time function control to the current time function control. The following criteria may be used alternately or cumulatively.

For the switching-on of the power semiconductor the criteria are as follows:

a) the current reaches a maximum value;

b) the current time function drops by a predetermined amount;

c) the voltage drops by a predetermined amount;

d) the voltage time function drops by a predetermined amount, in particular when the first derivative of the collector-emitter voltage falls below a predetermined negative threshold value, or the absolute value of the first derivative of the collector-emitter voltage exceeds a predetermined positive threshold value;

e) the power semiconductor is an IGBT, and the gate-emitter voltage reaches a predetermined value;

f) the power semiconductor is an IGBT, and the time function of the gate-emitter voltage drops by a predetermined amount;

g) the power semiconductor is a MOS-FET, and the gate-source voltage reaches a predetermined value; and h) the power semiconductor is a MOS-FET, and the time function of the gate-source voltage drops by a predetermined amount.

For the switching-off of the power semiconductor the criteria are as follows:

a) the voltage reaches a predetermined value;

b) the voltage time function drops by a predetermined amount;

c) the current drops by a predetermined amount;

d) the absolute value of the current time function drops, in particular when the first derivative of the collector-emitter voltage falls below a predetermined negative threshold value or if the absolute value of the first derivative of the collector-emitter voltage exceeds a predetermined positive value by a predetermined amount;

e) the power semiconductor is an IGBT and the gate-emitter voltage reaches a predetermined value;

f) the power semiconductor is an IGBT and, when the first derivative of the gate-emitter voltage first assumes a negative value and then a substantially smaller value, and finally falls below a predetermined value, the moment in time when it falls below that predetermined value;

g) the power semiconductor is a MOS-FET and the gate-source voltage reaches a predetermined value;

h) the power semiconductor is a MOS-FET and, when the first derivative of the gate-source voltage first assumes a negative value and then a substantially smaller value, and finally falls below a predetermined value, the moment in time when it falls below that predetermined value.

All these measures and the criteria have the advantage to exactly determine the moments in time when the switching-over from the control of the one parameter to the control of the respective other parameter shall be effected.

In a preferred embodiment of the inventive method a signal corresponding to a desired value of the voltage time function and a signal corresponding to an actual value of the voltage time function are generated for controlling the voltage. These signals are compared with one another and the difference is again compared with a reference value. If the reference value is exceeded, the difference is processed as a control signal, whereas when the difference falls below the reference value, a zero signal is processed as the control signal.

Correspondingly, it is preferred when for controlling the current a signal corresponding to a desired value of the current time function and a signal corresponding to the actual value of the time function are generated. These signals, too, are compared with one another and the difference is again compared with a reference value. If the reference value is exceeded, the difference is processed as the control signal, whereas when the difference falls below the reference value, a zero signal is processed as the control signal.

Both concepts for controlling the collector-emitter voltage and the collector current, respectively, have the advantage that the afore-mentioned control circuits may be designed with simple and cheap elements and in simple configurations.

In this context it is preferred when the desired values may be set, for example by means of adjustable resistors.

According to the invention two further types of methods for controlling the voltage time function and the current time function are preferred, which may also be used independently from other features of the present invention.

On the one hand, it is preferred for controlling the voltage time function to generate a signal corresponding to a desired value of the voltage time function and a signal corresponding to the actual value of the voltage time function, to compare these signals with one another and to again compare the difference with a reference value. If the reference value is exceeded, the difference is processed as a control signal and the control signal is transformed non-linearly.

Correspondingly, it is preferred when for controlling the current time function a signal corresponding to a desired value of the current time function and a signal corresponding to the actual value of the current time function are generated, these signals are compared with one another and the difference is again compared with a reference value. If the reference value is exceeded, the difference is further processed as a control signal, and the control signal is transformed non-linearly.

These measures have the advantage that extreme non-linearities of certain power semiconductors, in particular the non-linearity of IGBTs, may effectively be compensated for, as well as the transfer characteristics of the control circuit consisting of the IGBT and its associated drive circuit.

Moreover, the invention prefers to limit the voltage to a predetermined threshold value.

This measure has the advantage that damages across the collector-emitter path and the drain-emitter path, respectively, are effectively avoided.

According to further embodiments of the invention the current is limited to a predetermined threshold value when the power semiconductor is switched-on. Alternately, it may be provided that the power semiconductor be cut-off when the current exceeds a predetermined threshold value.

Seen as a whole, these afore-mentioned measures have the advantage that the inventive apparatus operates safely with respect to excess voltages and with respect to short circuits so that the standard malfunction situations have all been taken care of.

According to further embodiments of the invention, the features of which may also be used independently from the other features of the present invention, the power semiconductor is controlled by means of an output stage, wherein the output stage is operated as a current output stage at lease over certain periods of time.

This measure has the advantage that the stability of the control circuit is increased by using a current output stage instead of a voltage output stage. The dominant cut-off frequency of the transfer function of an open control circuit is determined by the steepness of the controlled current source and the input capacity of the power semiconductor, when a current output stage is used, whereas the other cut-off frequencies, in contrast, are located at substantially higher frequencies. When, in contrast, for controlling a power semiconductor a voltage output stage is used, the poles of the loop amplification are not separated, so that there is a risk that the control circuit oscillates.

The invention, insofar, is contrasted to prior art driver circuits utilizing a low-impedance control directly or via resistors (typically between 5 and 100 $\Omega$) between the driver output and the power semiconductor gate. The circuit according to the invention namely has a controlled current source in its output with a particularly high output impedance of typically more than 10 $\Omega$. In that case the output stage, as already explained, is transferred from the "ON" to the "OFF" state after the switching-over process. For the static output condition it then assumes a predetermined voltage state at its output. The output stage, therefore, is novel with its two distinct characteristics related to its output behavior. For that purpose, the output stage, as also already mentioned, changed from a high-impedance to a low-impedance output resistance after the switching-off process, i.e. the output stage is latched. The latching is effected in order to avoid that the IGBT changes its output stage due to interferences.

Within this group of embodiments it is particularly preferred when the output stage is essentially operate as a current output stage during the switching process.

This measure has the advantage that the afore-explained advantages become effective in particular during the period of time of the transients, when the power semiconductors have to be switched-over.

As a supplemental measure it is further preferred when the output stage is operated as a voltage output stage in the absence of a switching process.

This measure has the advantage of defined operational conditions for the subsequent stationary condition of the power semiconductor. This is particularly suitable when two power semiconductors are switched in series and switch reciprocally. In that situation it must be guaranteed that the switching of the one power semiconductor does not cause an inadvertent switching of the other power semiconductor.

Accordingly, within this group of embodiments it is preferred when the power semiconductor is switched to-and-fro between two fixed states by means of the current output stage during the switching process.

If we now consider the two situations in which the power semiconductor changes from a state "OFF" into a state "ON", it will in both cases be controlled by the current output stage with low-impedance and with constant voltage.

For effecting a change in the state of the current output stage, various criteria have been developed within the scope of the present invention which, again, may be used alternately or cumulatively, i.e. in any conceivable combination.

For a transition into a state "OFF" of the power semiconductor, i.e. a transition from a high-impedance output resistance to a low-impedance output resistance with fixed output voltage, the criteria are as follows:
  a) approaching a minimum current value;
  b) the absolute value of the current time function falls by a predetermined amount;
  c) the power semiconductor is an IGBT and the gate-emitter voltage falls by a predetermined amount;
  d) the power semiconductor is a MOS-FET and the gate-source voltage falls by a predetermined amount.

For a change into a state "ON" of the power semiconductor, i.e. a transition from a high-impedance output resistance to a low-impedance output resistance with fixed output voltage, the criteria are as follows:
  a) approaching a minimum voltage value by a predetermined amount;
  b) the absolute value of the voltage time function falls by a predetermined amount;
  c) the power semiconductor is an IGBT and the gate-emitter voltage rises by a predetermined amount;
  d) the power semiconductor is a MOS-FET and the gate-source voltage rises by a predetermined amount.

As already mentioned, the invention provides a driver with a sequence control for switching between the various controls of the above-mentioned parameters. The sequence control is provided according to the invention for controlling the current time function first and the voltage time function second when switching-on the power semiconductor, whereas for switching the power semiconductor off, the voltage time function is controlled first and the current time function is controlled second.

According to a preferred variation of the inventive apparatus, circuit means are provided for detecting and evaluating the voltage time function and the current time function and for generating control signals from this evaluation. In that case the sequence control comprises:
  a) a first output for switching the power semiconductor on;
  b) a second output for switching the power semiconductor off;
  c) a first cross-over switch for feeding to the first and the second output the first control signal and the second control signal, respectively, the first cross-over switch being adapted to be operated by a first switching signal; and
  d) a second cross-over switch between the first cross-over switch and the first and the second output for connecting the first or the second output with the first cross-over switch, the second cross-over switch being adapted to be operated by a second switching signal.

This embodiment of the circuitry enables the implementation of the various methods discussed in detail above, and further has the advantages of a high safety against interferences at low control voltages, as will be described below in further detail.

According to a variation of the afore-mentioned circuitry, the driver comprises differentiating stages for generating the first derivative of the voltage and of the current, respectively, for evaluating the voltage time function and the current time function.

Moreover, it is preferred when the driver comprises control stages for generating control signals from the evaluation, the control signals comprising a subtracting stage for generating a comparison between a desired value and an actual value of the voltage time function and of the current time function.

In the case of a voltage control the driver preferably comprises control stages for generating control signals from the evaluation, the control stages comprising characteristic line stages generating for a negative input signal a constant output signal and for a positive input signal an output signal falling from a constant value down to zero and remaining zero thereafter.

Accordingly, in the case of a control of the current time function it is preferred when the driver comprises control stages for generating control signals from the evaluation, the control stages comprising a characteristic line stage which for a negative input signal generates a positive constant output signal, and for a positive input signal generates an output signal falling from the positive constant value down to zero and below zero thereafter.

Moreover it is preferred when the driver comprises dividing stages for generating control signals from the evaluation.

When the afore-mentioned alternatives are implemented all together, this is preferably effected by arranging within the signal flow the differentiating stages first, followed by the subtracting stages, followed by the characteristic curve stages, and followed by dividing stages.

Finally it is preferred when the driver comprises a linearizing stage for generating control signals from the evaluation, the linearizing stage being preferably configured according to the so-called translinear principle according to Gilbert.

In a practical setup for the above-mentioned circuits the first cross-over switch is configured by transistors having base electrodes, the base electrodes being held at a constant potential by means of a clamping circuit.

For all conceivable applications of the invention it holds equally true that the invention is directed to a method of operating a corresponding apparatus, circuit or the like, but also relates to an apparatus, circuit or the like itself.

As was already mentioned, the invention may be utilized advantageously for various fields of application.

First, inverters have to be mentioned, as are used for operating induction motors, also referred to as "asynchronous motors" with variable speed, in which a frequency-variable three-phase voltage is generated by switching power semiconductors on and off.

Another preferred field of application are ignition circuits for internal combustion engines as used in motor vehicles. In these circuits a pulsed output voltage for ignition purposes is generated from an input DC voltage by switching power transistors on and off.

Finally, the invention is generally applicable for so-called switched-mode power supplies which are standard component in various electrical and electronic apparatuses. In this connection an application for so-called power-factor-controllers (PFC) is also to be taken into account. Such PFCs are conventionally used as an input stage for switched-mode power supplies for drawing a strictly sinusoidal voltage and current, respectively, from the mains supply. Here, too, the invention may be used with considerable advantages.

Further advantages will become apparent from the description and the enclosed drawing.

It goes without saying that the afore-mentioned features and those that will be explained hereinafter may not only be used in the particularly given combination, but also in other combinations or alone without leaving the scope of the present invention.

DETAILED DESCRIPTION OF THE PREFERRED EMBODIMENTS

Figure 1A:
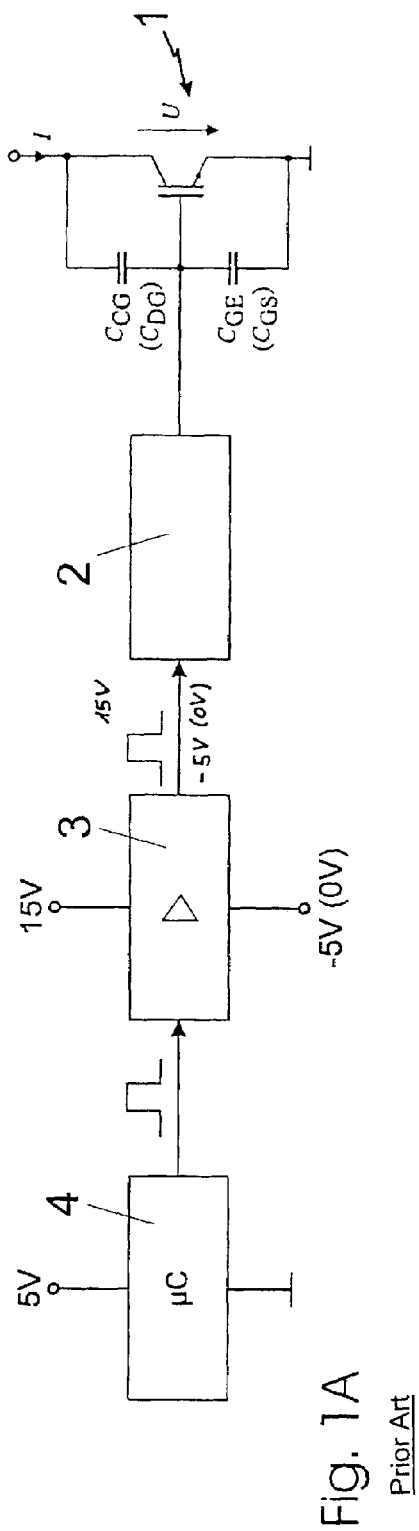
FIGS. 1A through 1C show simplified circuit diagrams for explaining the control of a power semiconductor according to the prior art.

FIG. 1 on a highly schematic level shows a block diagram with a power semiconductor 1 which may be either an IGBT or a MOS-FET. A current I flows through power semiconductor 1 and a voltage U appears across the latter. For an IGBT, the input capacitance of the power semiconductor 1 corresponds to the gate-emitter capacitance $C_{GE}$ in parallel to the effective feed-back capacitance $C_{CG}$. The effective feedback capacitance $C_{CG}$ is a function of the collector emitter voltage $U_{CE}$.

For a MOS-FET the input capacitance of semiconductor 1 corresponds to the gate-source capacitance $C_{GS}$.

Figure 1B:
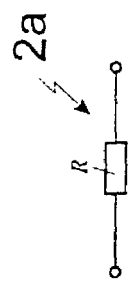
Figure 1C:
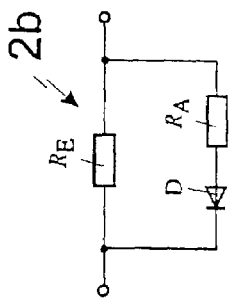

Power semiconductor 1 is inputted via a network 2, two prior art embodiments of which being shown in FIGS. 1B and 1C.

Network 2 is controlled by an output stage 3 which, in turn, receives its signals from a micro-controller 4.

Micro-controller 4 conventionally has a supply voltage of 5 V and outputs control signals at TTL-level. Output stage 3 has a supply voltage of conventionally 0/15 V or −5/15 V. The control signals from micro-controller 4 are processed within output stage 3 which generates switch-over signals switching between 0 V and 15 V or between −5 V and 15 V, respectively.

Network 2 is provided to avoid that power semiconductor 1 or its input capacitance $C_{GE}$ or $C_{GS}$, respectively, are not subjected to too high voltage jumps. In the simplest prior art case as shown in FIG. 1B, network 2a solely consists of an Ohmic resistance R. In that case the input capacitance is slowly charged or discharged, respectively, via the $R_C$-member consisting of resistance R and the capacitance. These events, therefore, are basically the same in the event of switching-on and in the event of switching-off power semiconductor 1.

Considering that this prior art approach does not show sufficient precision, one has suggested the alternate network 2b of FIG. 1C in which two resistances $R_E$ and $R_A$ are switched in parallel, however, with a diode D being arranged in the path of resistance $R_o$. Accordingly, during the switching-on of power semiconductor 1 only resistance $R_E$ is active, whereas during switching-off the parallel circuit of $R_E$ and $R_A$ becomes effective.

Although in this prior proposal one has differentiated between the switching-on and the switching-off, this holds true only for one specific point of operation so that there are no optimum conditions when the operational conditions change.

Figure 2A:
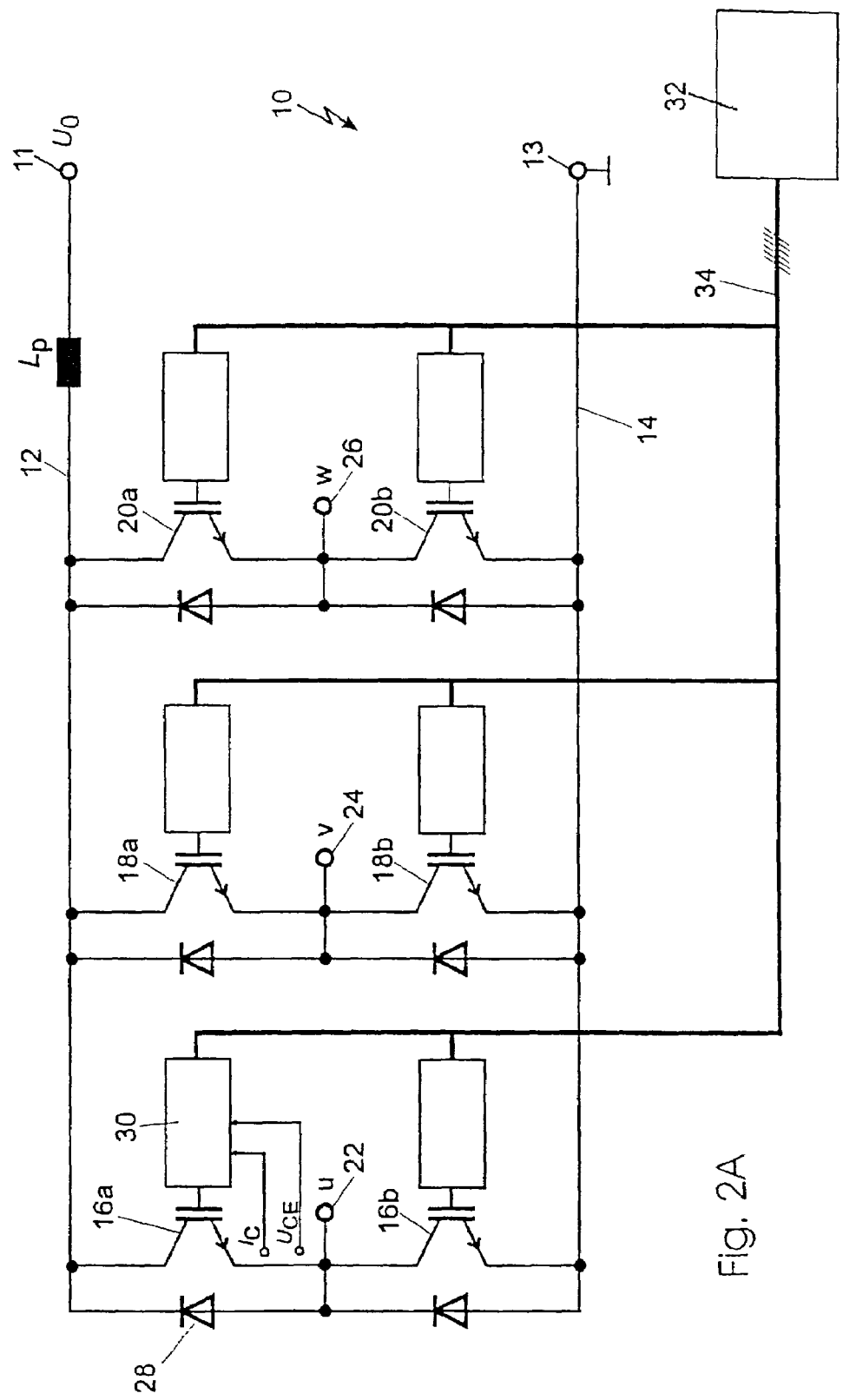
FIG. 2A shows a highly schematic circuit diagram of an embodiment of the invention, namely an apparatus for operating an induction motor at variable speeds.

FIG. 2A shows a first embodiment of a circuitry 10 according to the present invention on a highly schematic level. Circuitry 10 shows an inverter as used for inverting a direct current voltage $U_O$ into a frequency-variable three-phase voltage. Circuitries 10 of the type shown are typically used for operating electric motors at variable speed.

Circuitry 10 comprises a DC terminal with a voltage $U_O$ supplying a DC line 12. Analogously, reference numeral 13 designates a ground terminal being connected to a ground line 14.

In the depicted embodiment, power semiconductors, more specifically power transistors 16a, 16b and 18a, 18b and 20a, 20b, respectively, are switched in series and in pairs between DC line 12 and ground line 14. Power transistors 16 through 20 may be of various types. Without restricting the scope of the present invention in any way, the following description shall be based mainly on the example of so-called insulated gate bipolar transistors (IGBTs). However, it goes without saying that also other types of power semiconductors may be used within the scope of the present invention, for example MOS-FETs (cf. FIG. 2B).

Between the IGBTs 16a/16b, 18a/18b, 20a/20b, switched in series, terminals 22, 24 and 26 are arranged, the latter being connected to field windings of an electric motor, for example an induction motor, also referred to as "asynchronous motor". In FIG. 2A, these field windings are designated with u, v and w.

Further, all of the IGBTs are bridged by means of free wheeling diodes 28. Any of the six IGBTs 16a through 20b are each connected to a driver 30 via their control terminal. Drivers 30, in turn, are connected at their input with a micro-controller 32, namely via a data line 34.

In the upper left corner of FIG. 2A it is indicated that drivers 30 may further be subjected at their input to signals from special sensors and signal lines. These signals correspond to a voltage, preferably the collector emitter voltage $U_{CS}$ and to a current, preferably the collector current $I_C$. However, within the scope of the present invention one may also utilize other voltage or current signals of the power semiconductor (IGBT or MOS-FET, respectively). The afore-mentioned signals are evaluated and also partially transformed for that purpose, as will be described in further detail below.

Micro-controller 32 generates a switching signal by which the IGBTs 16a through 20b are brought into their operational conditions "ON" and "OFF", respectively.

If in the scope of the present invention the term "switching" is used, this shall mean a switching operation within the power semiconductor (IGBT or MOS-FET, respectively), i.e. the change between the conditions "ON" and "OFF".

The term "switching-over", in contrast, shall relate to a process according to which within a switching process of the type specified before a transition is effected from a first internal control concept to a second internal control concept, as will be explained in further detail below.

Figure 2B:
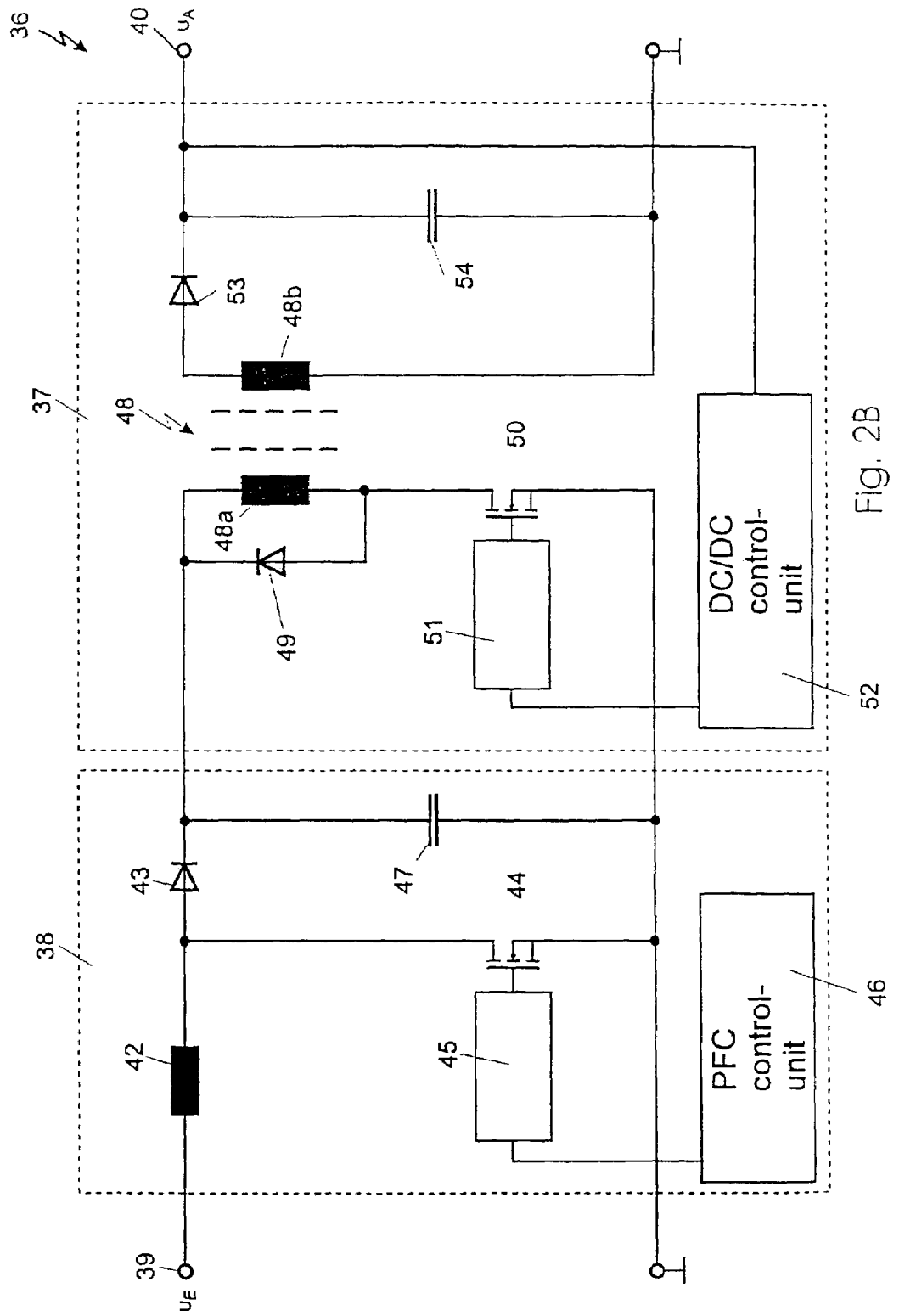
FIG. 2B shows a highly schematic circuit diagram of an embodiment of a switched-mode power supply arranged behind a power-factor-controller (PFC)

FIG. 2B shows another circuitry 36 on a highly schematical level. Circuitry 36 comprises a switched-mode power supply 37 arranged behind a so-called power-factor-controller (PFC) 38. Circuitry 36 is used for converting a first DC voltage $U_E$ into a second DC voltage $U_A$. Circuitry 36 may, for example, be utilized within power supplies of television sets, computers and other electronic apparatuses, namely for all applications where a constant output DC voltage shall be generated from a (constant or not constant) input DC voltage.

For that purpose circuitry 36 is provided with a first DC terminal 39, carrying a first DC voltage $U_E$, as well as with a second DC terminal 40, carrying a second DC voltage $U_A$.

PFC 38 comprises an inductance 42 connected to first DC terminal 39. A diode 43 connects inductance 42 with switched-mode power supply 37. A power transistor 34 is connected between an inductance 42 and diode 43 and is switched to ground. In the depicted embodiment power transistor 34 is a MOS-FET; as an alternative, an IGBT could also be used. MOS-RET 44 is controlled by a driver 45 which, in turn, is connected to a PFC control unit 46. Behind diode 43, a capacitor 47 is connected to ground.

The control within control unit 46 of PFC 38 is designed such that the current, drawn at first DC terminal 39 from first voltage $U_E$ and switched by means of power transistor 44 is influenced such that its envelope has the shape of a sine half wave. This guarantees that power is drawn from the mains supply with a sine wave.

Switched-mode power supply 37 comprises a transformer 48 having a primary winding 48a being bridged by means of a diode 49 and being connected to ground via a power transistor 50. Power transistor 50 is likewise controlled by a driver 51 which, in turn, is connected to a control unit, namely a DC/DC control unit 52. DC/DC control unit 52 is, further, connected to second DC Terminal 40. In the depicted embodiment power transistor 50 is also a MOS-FET, however, could alternately be an IGBT. The secondary winding 48b of transformer 48 is connected to second DC terminal 40 via a diode 53. The latter is, further, connected to ground via a capacitor 54.

As will be described in further detail below, MOS-FETs 44 and 50 (exactly like IGBTs 16 through 20 in FIG. 2A) are controlled such that they are switched according to the criteria described in detail in the introductory part of the description, when switched, i.e. when they change from the condition "ON" into the condition "OFF" or vice versa. In the circuit of FIG. 2b this is effected by PFC control unit 46 for MOS-FET 44 and DC/DC control unit for MOS-FET 50, in cooperation with driver 45 and driver 51, respectively.

In contrast to conventional circuits, as explained in FIG. 1, a hard and uncontrolled switching is avoided which could occur when during the beginning of the switching operation the capacity input of the power semiconductor is subjected to a voltage jump of e.g. 0 to 15 V causing a spontaneous high current flowing into the input electrode of the power semiconductor. This, in turn, causes harmonics to be generated which, in turn, give rise to electromagnetic radiation. When motors are operated (FIG. 2A), displacement currents within the motor winding are generated. If, in contrast, the switching process would be slowed down, for example by means of the resistors shown in FIGS. 1B and 1C, this would give rise to dissipated power losses.

Figure 3A:
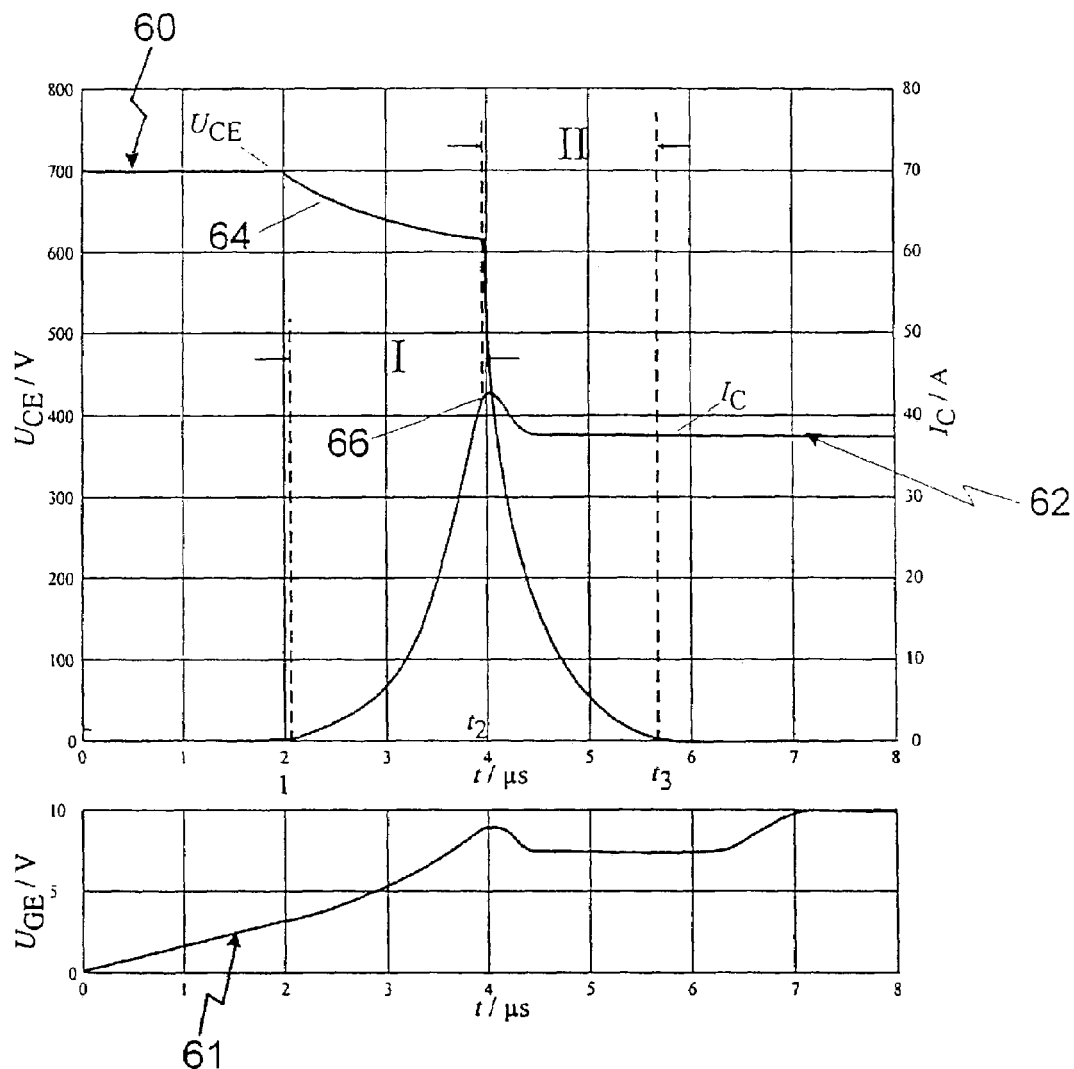
FIGS. 3A and 3B show diagrams for explaining the time function of the collector emitter voltage $dU_{CE}/dt$ and the collector current $dI_C/dt$ during the switching-on (FIG. 3A) and during the switching-off (FIG. 3B) of a power semiconductor according to the prior art.
Figure 3B:
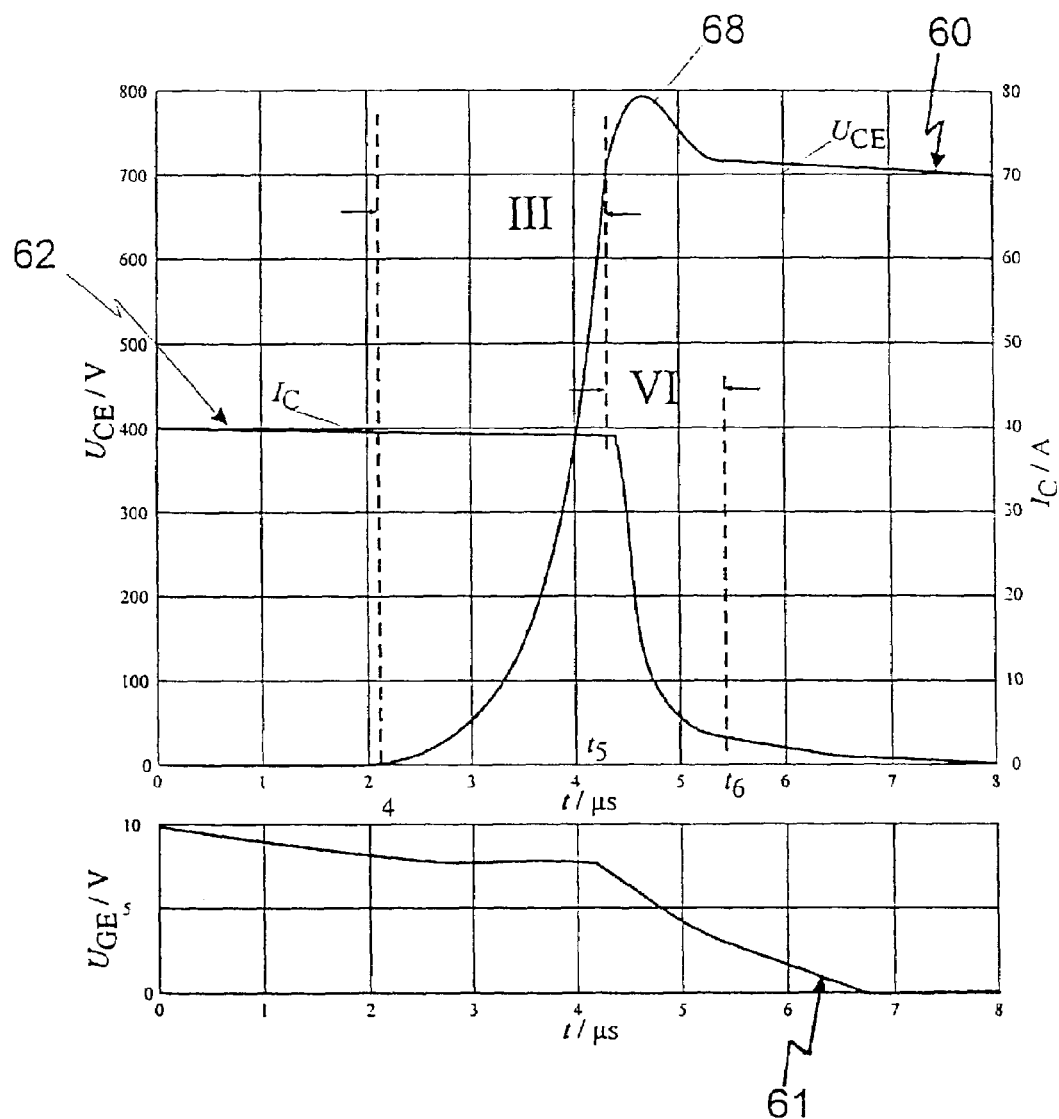
Figure 3C:
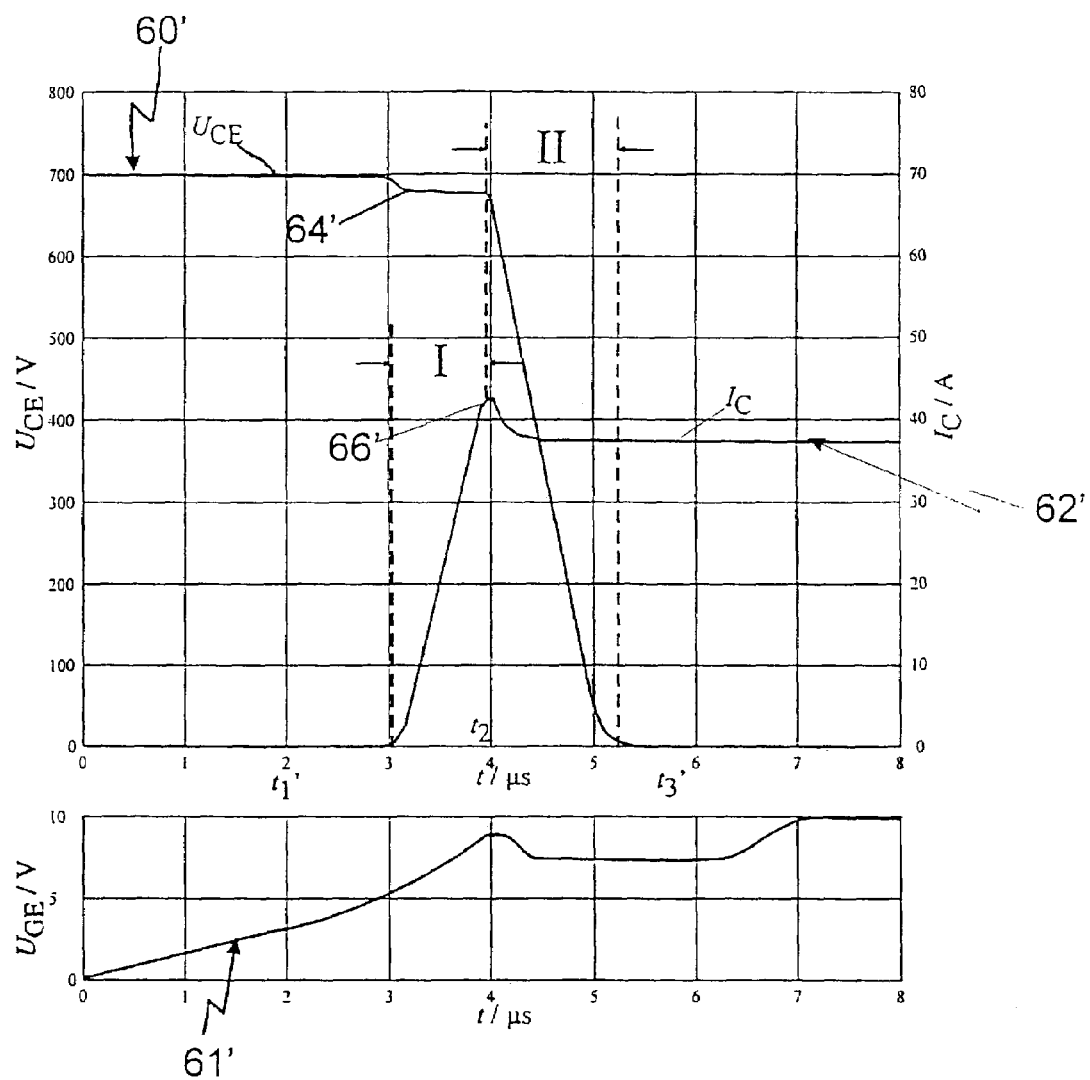
FIGS. 3C and 3D show diagrams corresponding to those of FIGS. 3A and 3B, however, for explaining the method according to the present invention.
Figure 3D:
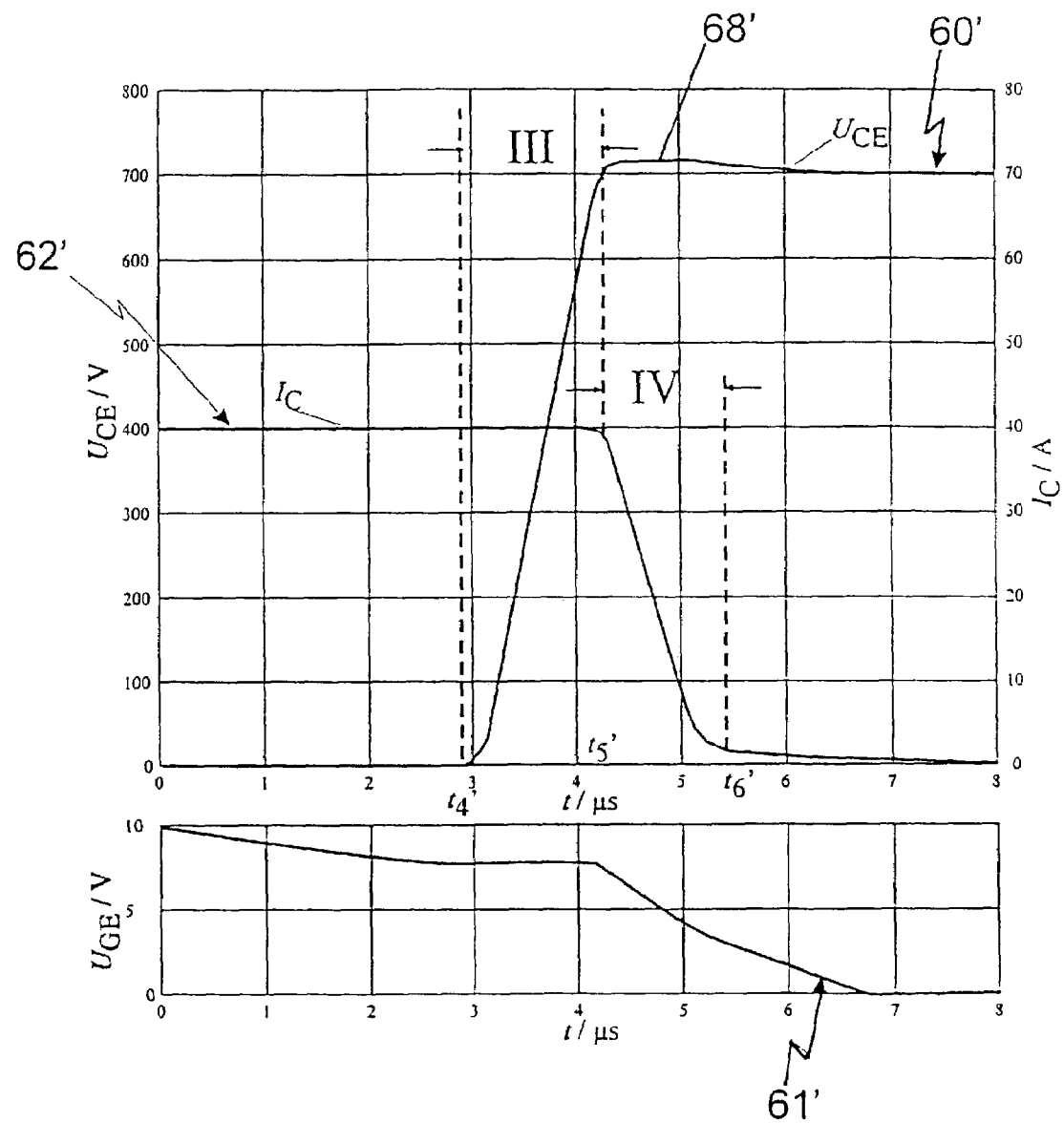

The current and voltage curves according to the prior art on the one hand and as obtained with the present invention on the other hand, respectively, are depicted in FIGS. 3A and 3B (prior art) and in FIGS. 3C and 3D (present invention).

FIGS. 3A through 3C show the uncontrolled and the controlled curves, respectively, of the collector-emitter-voltage $U_{CE}$, the collector current $I_C$, and the gate-emitter voltage $U_{GE}$ of an IGBT, all versus time t.

FIG. 3A shows the uncontrolled switching-on process of an IGBT and FIG. 3B shows the corresponding uncontrolled switching-off process. In contrast, FIGS. 3C and 3D show the controlled switching-on process and switching-off process, respectively, of an IGBT.

The term "time function" in the context of the present invention shall preferably, but not exclusively, mean the first derivative versus time of the respective quantity. Hereinafter, the first derivative is also identified as "edge steepness" or as "transient".

Considering now the switching-on process according to FIG. 2A (prior art, uncontrolled) and FIG. 2C (invention, controlled), one can identify curve 60 in FIG. 2A and 60' in FIG. 2C, respectively, as the principal curve of collector-emitter voltage $U_{CE}$. Curves 61 and 61', respectively, represent the principal curve of the gate-emitter voltage $U_{GE}$. Finally, curves 62 and 62', respectively, show the principal curve of the collector current $I_C$, all versus time t.

The switching-on process of the IGBT is initiated at $t_1$ and $t_1'$, respectively. The curves 62 and 62' for collector current $I_C$ in both cases rise from a zero value up to an operational value of e.g. about 38 A. Within curves 62 and 62' there is an overshoot 66 and 66' at about $t_2$ and $t_2'$, respectively, being caused by charge carriers of over-flooded free-wheeling diode 28 (cf. FIG. 2A) for the inductive load that must first be removed. This effect occurs in all such diodes.

The inclination of gate-emitter voltage $U_{GE}$ according to curves 61 and 61' is positive for $t<t_2$ and $t'<t_2'$, respectively. There is a local maximum value at $t_2$ and $t_2'$. During overshoot 66 and 66' free-wheeling diode 28 begins to receive inverse voltage. Collector-emitter voltage $U_{CE}$ according to curves 60 and 60' begins to drop from $t_2$ and $t_2'$, respectively, on, until it drops down to zero at $t_3$ and $t_3'$, respectively.

During this period of time, gate-emitter voltage $U_{GE}$ according to curves 61 and 61' remains almost constant. Already at $t_1$ and $t_1'$ curves 60 and 60' show a sudden voltage drop 64 and 64'. Voltage drop 64 and 64' occurs due to a parasitic inductance $L_P$ (FIG. 2A) within the intermediate circuit $U_0$. Voltage drop 64 and 64', however, is only associated to a minor change vs. time $dU_{CE}/dt$.

For the sequence controlled, i.e. for the control of collector-emitter voltage $U_{CE}$ and of collector current $I_C$ one now has to detect the proper moment in time $t_2$ and $t_2'$, respectively, and to use same for control purposes.

In FIGS. 3A and 3C, respectively, I designates the period of time between $t_1$ or $t_1'$, respectively, and $t_2$ or $t_2'$, respectively, whereas II designates the period of time between $t_2$ or $t_2'$, respectively, and $t_3$ or $t_3'$, respectively.

According to the present invention, the time function of collector current $I_C$, i.e. preferably the first derivative $dI_C/dt$ of collector current $I_C$ shall be controlled during period of time I, whereas the time function of collector-emitter voltage $U_{CE}$, preferably the first derivative $dU_{CE}/dt$ of collector-emitter voltage $U_{CE}$ shall be controlled during period of time II.

Whereas the moments in time $t_1$ and $t_3$ or $t_1'$ and $t_3'$, respectively, may be determined by a simple comparison with the respective zero value, an appropriate criterion must be found for detecting $t_2$ when a switch-over between an $I_C$ control and a $U_{CE}$ control shall be effected.

Starting from the saturation voltage at $t_4$ or $t_4'$, respectively, i.e. at the beginning of a period of time III, collector-emitter voltage $U_{CE}$ starts to rise. If the latter reaches the intermediate current voltage of e.g. 700 V, free-wheeling diode 28 begins to conduct and collector current $I_C$ begins to drop. This is the switch-over moment in time $t_5$ or $t_5'$, respectively, at which a switch-over from the control of the time function of the voltage to the control of the time function of the current shall be effected. During the subsequent period of time IV collector-emitter voltage $U_{CE}$ first rises due to the parasitic inductance $L_P$ within intermediate circuit $U_0$, as shown in FIG. 3B or 3D, respectively, at 68 or 68', respectively. Gate-emitter voltage $U_{GE}$ first drops but then remains constant during the period of time III (the so-called "Miller-plateau"). During period of time IV it leaves the plateau and then drops further down to zero.

During the switching-off process the sequence control must properly detect $t_5$ of $t_5'$, respectively.

As already mentioned in the introductory portion of the description, one may start from the following criteria, either alternately or cumulatively, with regard to the switching-on process:

a) current $I_C$ or $I_D$, respectively, reaches a maximum value;
b) the time function of current $I_C$ or $I_D$, respectively, drops by a predetermined amount;
c) voltage $U_{CE}$ or $U_{DE}$, respectively, drops by a predetermined amount, in particular when the first derivative of collector-emitter voltage $dU_{CE}/dt$ falls below a predetermined negative threshold value, or the absolute value of the first derivative of collector-emitter voltage $|dU_{CE}/dt|$ exceeds a predetermined positive threshold value;
d) the time function of voltage $U_{CE}$ or $U_{DS}$, respectively, drops by a predetermined amount;
e) the power semiconductor is an IGBT, and the gate-emitter voltage $U_{GE}$ reaches a predetermined value;
f) the power semiconductor is an IGBT, and the time function of the gate-emitter voltage $U_{GE}$ drops by a predetermined amount;
g) the power semiconductor is a MOS-FET, and the gate-source voltage $U_{GS}$ reaches a predetermined value;
h) the power semiconductor is a MOS-FET, and the time function of the gate-source voltage $U_{GS}$ drops by a predetermined amount.

In the case of a switching-off of the power semiconductor, the following criteria may be used analogously:

a) voltage $U_{CE}$ or $U_{DS}$, respectively, reaches a maximum value;
b) the time function of voltage $U_{CE}$ or $U_{DS}$, respectively, drops by a predetermined amount;
c) current $I_C$ or $I_D$, respectively, drops by a predetermined amount;
d) the absolute value of the time function of current $I_C$ or $I_D$, respectively, drops by a predetermined amount, in particular when the first derivative of the collector-emitter voltage $dU_{CE}/dt$ falls below a predetermined negative threshold value, or the absolute value of the first derivative of collector-emitter voltage $|dU_{CE}/dt|$ exceeds a predetermined positive threshold value;
e) the power semiconductor is an IGBT, and the gate-emitter voltage $U_{GE}$ reaches a predetermined value;
f) the power semiconductor is an IGBT, and, when the first derivative of the gate-emitter voltage $dU_{GE}/dt$ first assumes a negative value and, subsequently, a considerably smaller value and, finally, falls below a predetermined value, the moment in time of the falling below the predetermined value;
g) the power semiconductor is a MOS-FET and the gate-source voltage $U_{GS}$ reaches a predetermined value;
h) the power semiconductor is a MOS-FET, and, when the first derivative of the gate-source voltage $dU_{GS}/dt$ first assumes a negative value and, subsequently, a considerably smaller value and, finally, falls below a predetermined value, the moment in time when it falls below the predetermined value.

As soon as one or more of the afore-mentioned criteria are fulfilled, depending on the particular case, the following steps are taken:

during the switching-on of power semiconductor 1 or 16, 18, 20, respectively, or 44, 50, respectively, the time function of current $I_C$ or $I_D$, respectively, is controlled first and the time function of voltage $U_{CE}$ or $U_{DS}$, respectively, is controlled subsequently;

during the switching-off of power semiconductor 1 or 16, 18, 20, respectively, or 44, 50, respectively, the time function of voltage $U_{CE}$ or $U_{DS}$, respectively, is controlled first and the time function of current $I_C$ or $I_D$, respectively, is controlled subsequently.

Figure 4:
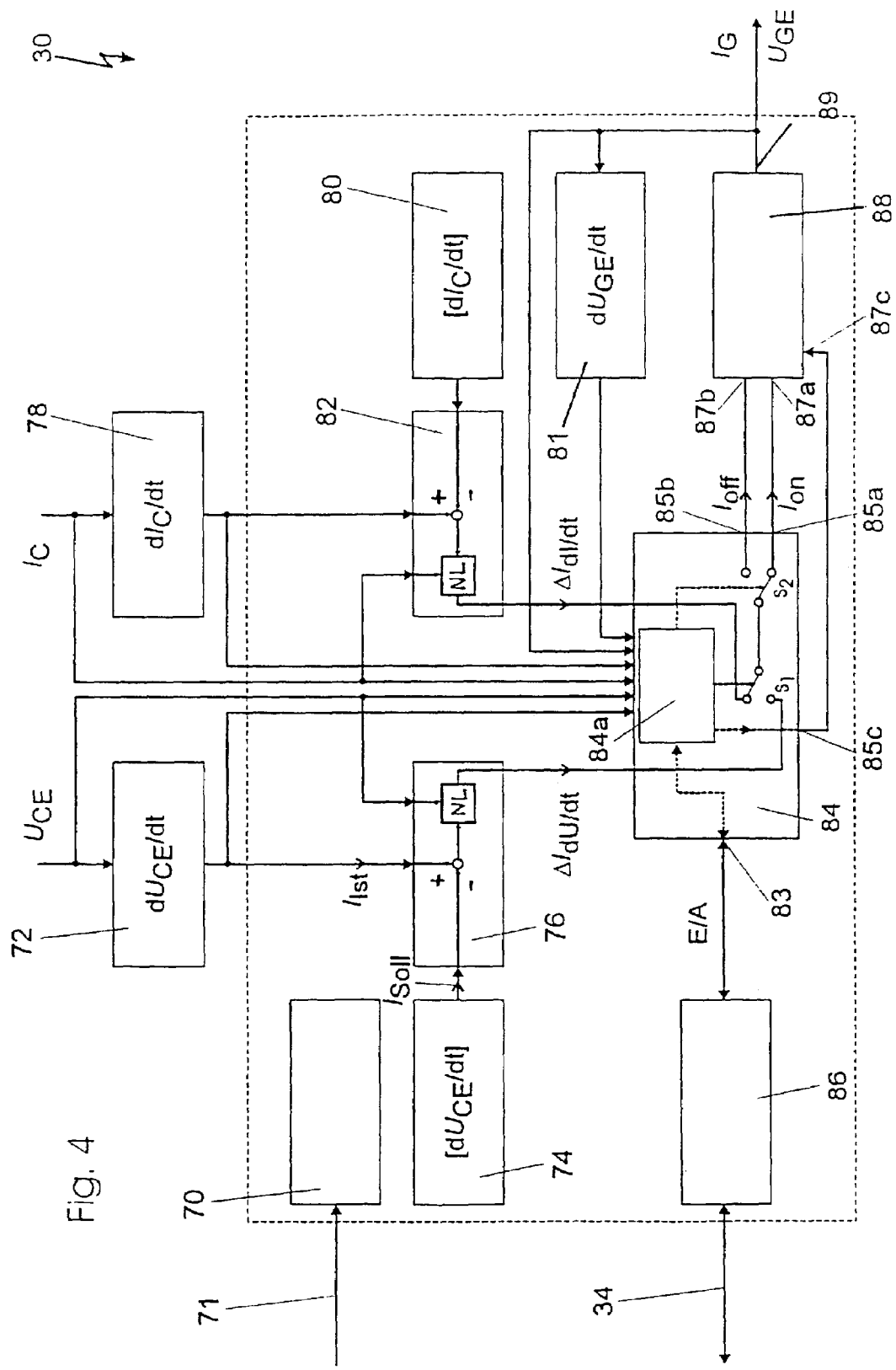
FIG. 4 is a highly schematic block diagram of an embodiment of a driver according to the present invention, as may be used in a circuit according to FIG. 2.

FIG. 4 shows the basic structure of driver circuit 30.

In the block diagram of FIG. 4 reference numeral 70 designates a supply voltage module. Supply voltage module 70 is connected to a DC line 71.

For controlling the time function, preferably the first derivative of collector-emitter voltage $dU_{CE}/dt$ a first differentiating stage 72 is provided. First differentiating stage 72 is fed at its input with a signal corresponding to collector-emitter voltage $U_{CE}$. First differentiating stage 72 generates an actual signal, preferably as a current signal $I_{ist}$.

Within the control circuit there is further provided a first desired value stage 74 in which a predetermined nominal or desired value for the time function collector-emitter voltage $[dU_{CE}/dt]$ may be set, likewise as current signal $I_{soll}$. Within an electronic circuit this may be effected e.g. by means of a potentiometer or the like.

The output signals of first differentiating stage 72 and of first desired value stage 74 are fed to a first control stage 76. First control stage 76 generates a difference signal $I_{ist}-I_{soll}$. The difference signal $I_{ist}-I_{soll}$ is fed to a non-linear stage NL, the output of which being likewise a current signal $\Delta I_{dU/dt}$. A signal corresponding to collector-emitter voltage $U_{CE}$ is also fed to non-linear stage NL, as will be described further below. Non-linear stages NL are shown with further details in FIGS. 6 and 10.

Analogously a control circuit is provided for collector current $I_C$.

A second differentiating stage 78 receives a signal corresponding to collector current $I_C$ and generates its first derivative $dI_C/dt$.

A corresponding nominal or desired value $[dI_C/dt]$ is generated in a second desired value stage. Both values are again fed to a second control stage 62 in which the difference signal $I_{ist}-I_{soll}$ is again transferred via a non-linear stage NL to the output as a current signal $\Delta I_{dI/dt}$. Further, also in this case a signal corresponding to collector current $I_C$ is fed to non-linear stage NL.

A third differentiating stage 81 transforms input value $U_{GE}$ into output value $dU_{GE}/dt$.

Both output signals $\Delta I_{dU/dt}$ and $\Delta I_{dI/dt}$ are fed to a sequence control 84 effecting the switch-over for the controls, as described above in connection with FIGS. 3A through 3D. Sequence control 84 comprises internal logics 84a generating switching signals for switches $S_1$ and $S_2$ according to the above-explained criteria for the switching process of the power semiconductors. In FIG. 4 this is indicated with dashed lines within sequence control 84.

Sequence control 84, hence, comprises cross-over switch $S_1$ for activating either the $dU_{CE}/dt$ control or the $dI_C/dt$ control, as well as cross-over switch $S_2$ for the switching-on and the switching-off of the power semiconductor (IGBT).

Sequence control 84, further, comprises evaluation means for the physical conditions of the power semiconductor and of the operational state ON/OFF for controlling cross-over switches $S_1$ and $S_2$, as well as a feedback in the event of a malfunction.

Sequence control 84 comprises a plurality of inputs for input signals $U_{CE}$, $I_C$ and $U_{GE}$, the inputs being connected to blocks 72, 76, 78, 81 and 82. Moreover, another input 83 is provided as well as outputs 85a, 85b, and 85c being connected to inputs 87a, 87b, and 87c of an output stage 88. Within sequence control 84 the signals are guided essentially via cross-over switches $S_1$ and $S_2$.

Within sequence control 84 cross-over switch $S_1$ switches either control signal $\Delta I_{dU/dt}$ for the time function of the voltage or control signal $\Delta I_{dI/dt}$ for the time function of the current (both being current signals) to cross-over switch $S_2$. Cross-over switch $S_2$ feeds the control signal selected by cross-over switch $S_1$ either to output 85a or to output 85b of sequence control 84.

Cross-over switch $S_1$ is actuated by logics 84a at $t_2'$ or $t_5'$, respectively. These moments in time are generated from the time functions of signals $U_{CE}$, $dU_{CE}/dt$, $I_C$, $dI_C/dt$, $U_{GE}$ and $dU_{GE}/dt$, as explained above, wherein these signals are directly fed to sequence control 84, as may also be taken from FIG. 4 where corresponding signal lines are clearly shown.

An interface 86 is connected to further input 83 of sequence control 84. An input of interface 86 is connected to micro-controller 82 via a data line 34. The output of output stage 88 is designated at 89. The output of output stage 88 carries a control signal $I_C$ for the power semiconductor, i.e. for the IGBT or the MOS-FET.

The depiction in FIG. 4 is not to be understood to comprise all conceivable functions. Instead, further open-loop or close-loop control circuits may be provided. For example, one could provide a supply voltage control or a temperature control for driver 30. Further, one might control collector-emitter voltage $U_{CE}$ and/or collector current $I_C$ with respect to e.g. maximum values $I_{Cmax}$ or minimum values $I_{Cmin}$. By doing so one could for example limit collector-emitter voltage $U_{CE}$ to a maximum value $U_{CEmax}$. Further, it would be possible in that way to limit collector current $I_C$ to a maximum value $I_{Cmax}$ in the event of a short circuit or to switch the IGBT entirely off when collector current $I_C$ exceeds a predetermined threshold value $I_{Cmax}$.

In that connection one could of course also generate indicator signals that could be processed via interface 86.

Interface 86 could be connected to micro-controller 32 via opto-couplers in order to separate potentials. Interface 86 receives corresponding control signals from micro-controller 32 and generates signals for input 83 of sequence control 84 to control cross-over switch $S_2$ bringing the IGBT into the states "ON" or "OFF".

In the context of the present invention sequence control 84 has various objects going far beyond the objects known from prior art.

According to the condition of micro-controller 32 sequence control 84 controls output stage 88 so that the latter supplies a positive or a negative current to the control terminal of the power semiconductor or the IGBT, respectively. Sequence control 84, further, guarantees that the $dU_{CE}/dt$ control and the $dI_C/dt$ control are never operative simultaneously but that only the one or the other control is activated according to the prevailing time function or transient, instead. Therefore, the two controls can never affect each other. Any failure in collector current $I_C$ during the $dU_{CE}/dt$ control or any failure of collector-emitter voltage $U_{CE}$ during the $dI_C/dt$ control, respectively, are, therefore, effectively suppressed. The voltage transient and the current transient may, therefore, be controlled independently from one another.

Via output 85 sequence control 84 provides information to output stage 88 indicating the state (latched or unlatched) which output stage 88 shall assume.

Sequence control 84, further, minimizes delay times, i.e. on the one hand the period of time between an order "ON" or "OFF", respectively, from micro-controller 32 and the occurrence of the current or voltage transient, respectively, and, on the other hand, the period of time after the transients and the moment in time when the maximum or the minimum input voltage of the power transistor is reached.

As a matter of principle, sequence control 84, finally, may automatically and in a controlled manner disconnect the power transistor or may supply an error signal to micro-controller 32 via interface 86 in the event that a short circuit or another malfunction occurs.

Within blocks 72, 74 and 76 the $dU_{CE}/dt$ control controls the voltage transient $dU_{CE}/dt$ to a value having been set by desired value $[dU_{CE}/dt]$. The amount of desired value $[dU_{CE}/dt]$ may, as already mentioned, be set by means of a resistor. The desired value $dU_{CE}/dt$ is preferably detected by means of a capacitor. The capacitor is preferably connected with one terminal to the collector of the power transistor and with its other terminal to the low-impedance input of first differentiating stage 72 of driver circuit 30.

Speaking in more exact terms, first control stage 76 operates as a limiter. During voltage transient $dU_{CE}/dt$ the power transistor is fed with a constant current, being set such that in the absence of a control the desired value would only be slightly exceeded, i.e. by e.g. about 10% to 20%. In the presence of the control transient $dU_{CE}/dt$, however, it is limited to the set desired value. This control principle is highly advantageous because the transitions from the $dU_{CE}/dt$ control to the $dI_C/dt$ control may be configured easier and more steadily.

Another important feature of first control stage 76 consists in that an inverse correction circuit is utilized within the control circuit linearizing the non-linear transfer characteristics of the power transistor (cf. the description of FIGS. 8 and 9 below). This results in an excellent control also at low collector-emitter voltage levels. Using the linearization is of particular importance for the present invention and may, hence, also be used without the remaining features of the invention.

For the $dI_C/dt$ within the blocks 78, 80 and 82 the same holds true, mutatis mutandis, that was explained before in connection with the $dU_{CE}/dt$ control within blocks 72, 74 and 76. The desired value $dI_C/dt$ within second desired value stage 80 is likewise preferably set by means of a resistor. The detection of the desired value is preferably effected by means of a parasitic inductance. An additional current sensor could also be used, however, would not be required generally.

In contrast to the controls according to the prior art and further to the low-impedance output stage with two fixed voltages for the "ON" and the "OFF" state, respectively, output stage 88 is configured as a current controlled current output stage during the transient phases which may be latched according to the above-explained criteria. Here we also have an important aspect of the invention that may be used alone, i.e. without the remaining features of the invention. Using a current output stage during the switching process of the power transistors and a voltage output stage during the stationary state of the power transistors has several advantages:

First, the voltage transients and current transients depend on the input current and not on the input voltage of the power transistor, for example the IGBT. Therefore, no additional components are required between the output of driver 30 and the control input of the IGBT (cf above network 2 or 2a, respectively, and 2b in FIGS. 1A, 1B and 1C).

Further, the stability of the controlled circuitry of driver 30 is essentially improved.

Furthermore one takes advantage of the fact that currents may generally processed much faster as compared to voltages.

Finally, by using a current output stage during the switching process and a voltage output stage in the absence of a switching process, one can avoid an erroneous switching of a power transistor that should be in a stationary state, when such power transistors are switched in series (cf. further below in connection to FIG. 12).

Figure 5:
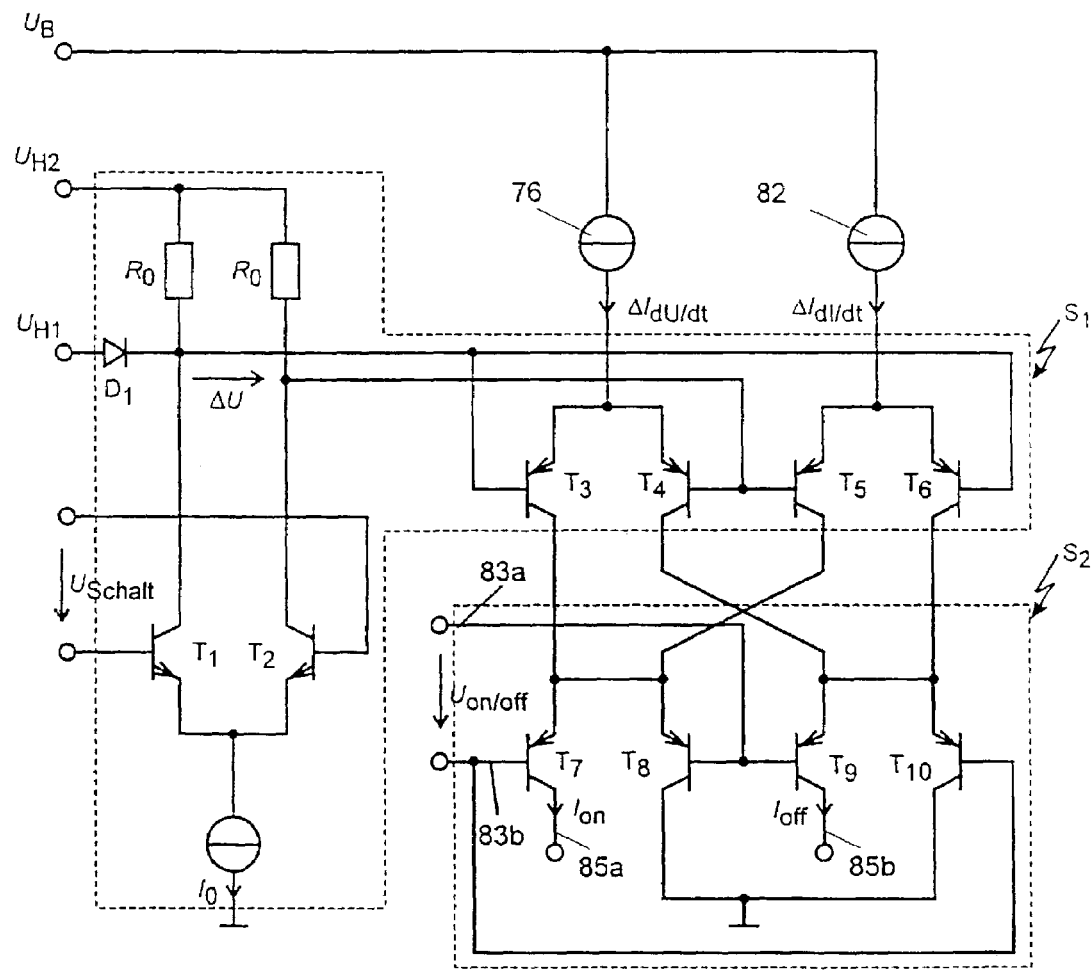
FIG. 5 is a circuit diagram of an embodiment of a sequence control as can be used in a driver as shown in FIG. 4.

FIG. 5 shows a detailed circuit diagram of an embodiment of cross-over switches $S_1$ and $S_2$ within sequence control 84 (FIG. 4).

In the circuit of FIG. 5 cross-over switch 51 is configured by transistors $T_1$ through $T_6$ having currents $\Delta I_{dU/dt}$ and $\Delta I_{dI/dt}$ being supplied by control stages 76 and 82, respectively. The outputs of differential amplifiers $T_3/T_4$ and $T_5/T_6$ are connected with corresponding interleaving to two differential amplifiers $T_7/T_8$ and $T_9/T_{10}$ operating as switches and corresponding to cross-over switch $S_2$. The switch voltage $U_{on/off}$ for differential amplifiers $T_7/T_8$ and $T_9/T_{10}$ is generated by interface 86 and supplied to corresponding inputs 83a and 83b. Voltage $U_{on/off}$ switches currents $I_{on}$ of $I_{off}$ to outputs 85a and 85b towards final stage 88.

Differential amplifiers $T_3/T_4$ and $T_5/T_6$ must be switched-over during the switching process in a fast and clean manner. They are controlled by another differential amplifier $T_1/T_2$, being switched by means of a voltage $U_{schalt}$. Transistors $T_1$ and $T_2$ are commonly connected with their emitters to a current source $I_0$. The collectors are connected with an input terminal $U_{H2}$ via equally dimensioned resistors $R_0$. Another input terminal $U_{H1}$ is connected to the collector of transistor $T_1$ via a diode $D_1$, as well as to the basis of transistors $T_3$ and $T_6$. The collector of transistor $T_2$ is connected to the basis of transistors $T_4$ and $T_5$. A voltage difference $\Delta U$ appears between the collectors of transistors $T_1$ and $T_2$.

Let us disregard diode $D_1$ for a moment. At the beginning of the switching process $U_{schalt}$ may, for example, be 1 V and output voltage $\Delta U$ at differential amplifier $T_1/T_2$ be positive. When switching the IGBT on, current $I_{dI/dt}$ will flow through transistors $T_5$ and $T_7$. Accordingly, $I_{on}=I_{dI/dt}$. If now during the switching-on process (FIG. 3C) the moment in time $t_2'$ for switching-over is detected, voltage $U_{schalt}$ is, e.g. switched to −1 V and, accordingly, $I_{on}=I_{dU/dt}$. During the switching-off process (FIG. 3D) we first have $I_{off}=I_{dU/dt}$ and, after the moment in time $t_3'$ for switching-over, we have $I_{off}=I_{dI/dt}$, so that a correct transition between the two controls has been effected.

Diode $D_1$ has the following function:

If the base potential of transistor $T_1$ is increased quickly, a parasitic error current will flow, caused by the parasitic capacitances through the collector transistor $T_1$. In order to avoid that the potential change at this collector will not drop by more than 60 mV, voltage $\Delta U$ is clamped by means of $D_1$ and the applied voltages $U_{H1}$ and $U_{H2}$, mentioned above.

We have, therefore, essentially three points, which are essential to obtain an optimum in the switching characteristics of cross-over switch $S_1$:

First, it is important that the critical differential amplifier $T_3/T_4$ and $T_5/T_6$ are controlled differentially. Second, it is important that voltage $\Delta U$ be held as small as possible. is important that voltage $\Delta U$ be held as small as possible. Third, it is important to clamp voltage $\Delta U$ by means of diode $D_1$.

Figure 6:
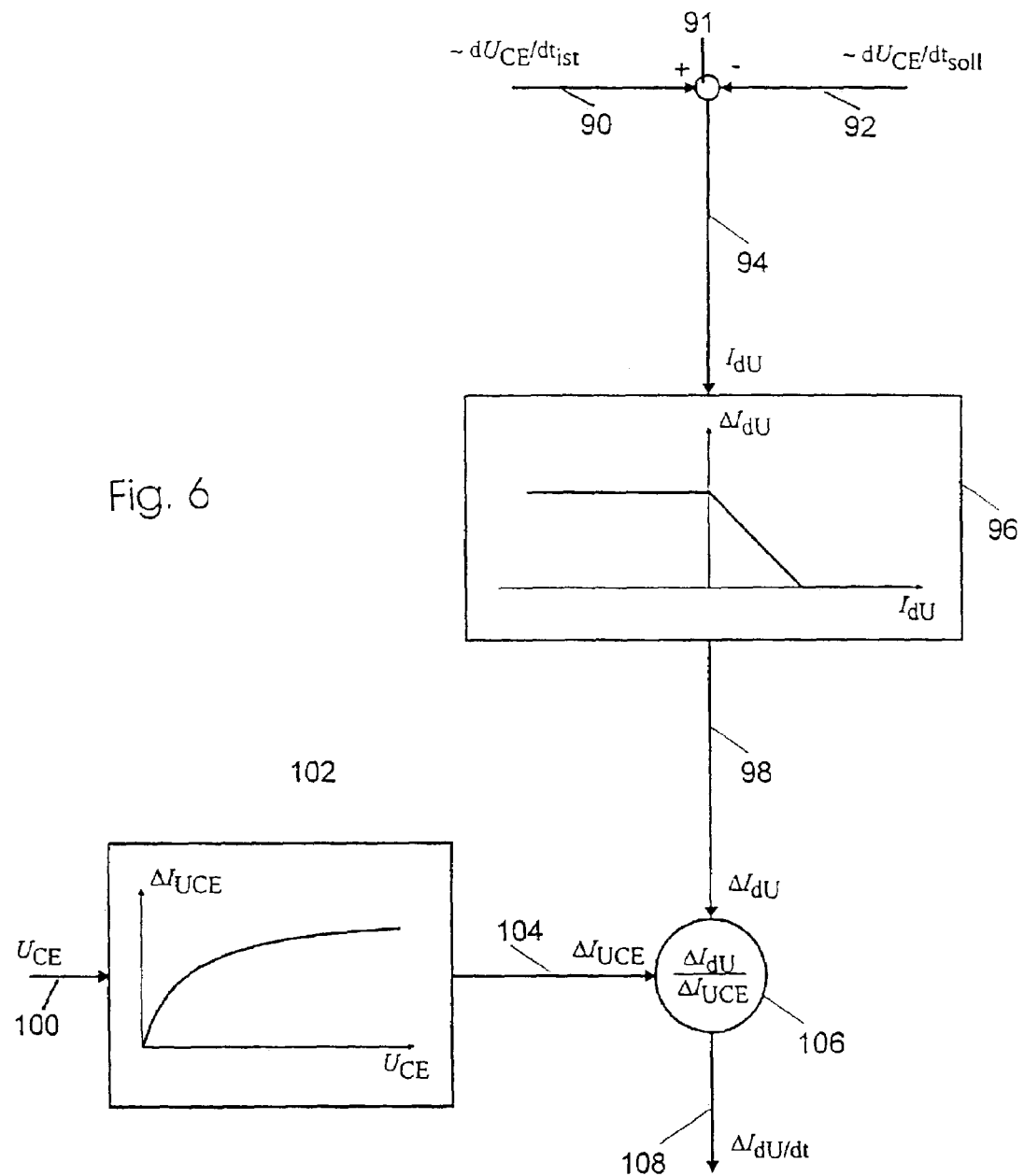
FIG. 6 is a block diagram of a circuit for controlling the time function of the collector emitter voltage $dU_{CE}/dt$ as may be used as a non-linear stage in the driver circuit of FIG. 4.

FIG. 6 shows the control of the time function of collector-emitter voltage $U_{CE}$ in further details, in particular its first derivative $dU_{CE}/dt$. The elements shown in FIG. 6 correspond to the non-linear circuitry NL within first control stage 76 of FIG. 4.

In FIG. 6 one may see a subtracting stage 91 connected to two lines 90 and 92. Line 90 carries an actual signal corresponding to the voltage transient $dU_{CE}/dt$, whereas line 92 carries a desired signal corresponding to voltage transient $dU_{CE}/dt$.

It is, therefore, possible to draw a difference signal at the output of subtracting stage 91 and, hence, via line 94, corresponding to the difference between the actual value and the desired value. The difference signal is generated as a current signal $I_{dU}$.

Difference signal $I_{dU}$ is now fed via line 94 to a characteristic curve stage 96. Characteristic curve stage 96 has a characteristic, according to which negative input values $I_{DE}$ are transformed into a constant value of an output signal $\Delta I_{dU}$, whereas positive input values $I_{dU}$ are transformed to an output value $\Delta I_{dU}$ falling down linearly to a zero value and remaining at that zero value.

The output signal $\Delta I_{dU}$ mentioned before is transferred from characteristic curve stage 96 to a dividing stage 106 via a line 98.

For otherwise controlling dividing stage 106 a signal corresponding to the collector-emitter voltage $U_{CE}$ is fed via a line 100 and is supplied to a linearizing stage 102. In the embodiment shown the linearizing stage 102 has a parabolic characteristic curve symmetric to the abscissa. Accordingly, the input variable quantity $U_{CE}$ is transformed into a degressively decreasing output variable quantity $\Delta I_{UCE}$. The output variable quantity $\Delta I_{UCE}$ is fed to dividing stage 106 via a line 104, as a second input variable quantity.

Within dividing stage 106, therefore, the output signal $\Delta I_{dU/dt}$ is generated and outputted to a line 108, and further on fed to sequence control 84 (FIG. 4). Blocks 96, 102 and 106, therefore, together configure the non-linear stage NL of first control stage 76 of FIG. 4.

The control principle of the circuit shown in FIG. 6 is as follows:

The desired value signal appearing on line 92 is subtracted from the actual value signal on line 90 by means of subtracting stage 91. If the resulting difference is positive, the output signal $\Delta I_{dU}$ at the output of characteristic curve stage 96 decreases. Accordingly, $\Delta I_{dU/dt}$ at the output of dividing stage 106 is likewise decreased. Therefore, gate current $I_G$ of the IGBT is also reduced to the required value.

The controller, therefore, operates as a limiter. This control principle has the advantage that during the transition between the $dU_{CE}/dt$ control and the $dI_C/dt$ control, and vice versa, the two control principles do not interfere.

Figure 7:
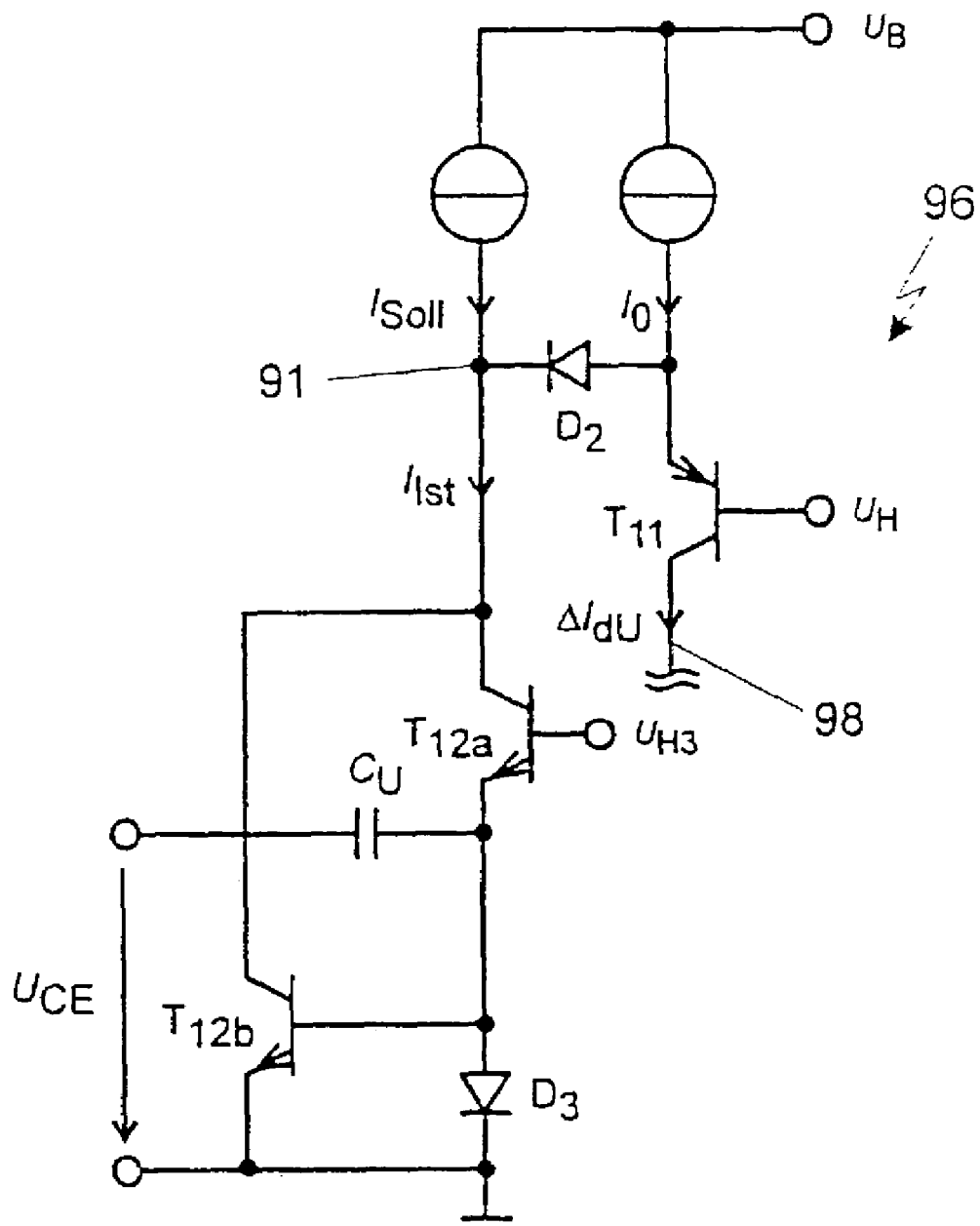
FIG. 7 is a detailed circuit diagram of an embodiment of the control circuit of FIG. 6.

FIG. 7 shows a detailed circuit diagram for the block diagram of FIG. 6.

Input voltage $U_{CE}$ generates a current through a capacitor $C_U$ being proportional to the first derivative $dU_{CE}/dt$, i.e. to the voltage transient. During the switching-off process this current flows from capacitor $C_U$ via a diode $D_3$ to ground.

During the switching-on process, however, the current flows from capacitor $C_U$ via a transistor $T_{12a}$ which, together with a transistor $T_{12b}$ and the afore-mentioned diode $D_3$ configurates a rectifier. For the actual current signal we have:

$$I_{ist} = C_u \cdot |dU_{CE}/dt|.$$

This current $I_{ist}$ is now compared with the desired value current signal $I_{soll}$. If current $I_{ist}$ in its absolute value is higher than current $I_{soll}$, the difference flows through diode $D_2$ and reduces the mother current $I_0$ which is fed to the circuitry of FIG. 7 from supply voltage $U_s$.

In FIG. 7, one may further see that the current signal $\Delta I_{dU}$ may be taken from the collector of a transistor $T_{11}$, the emitter of which being connected to diode $D_2$.

Figure 8:
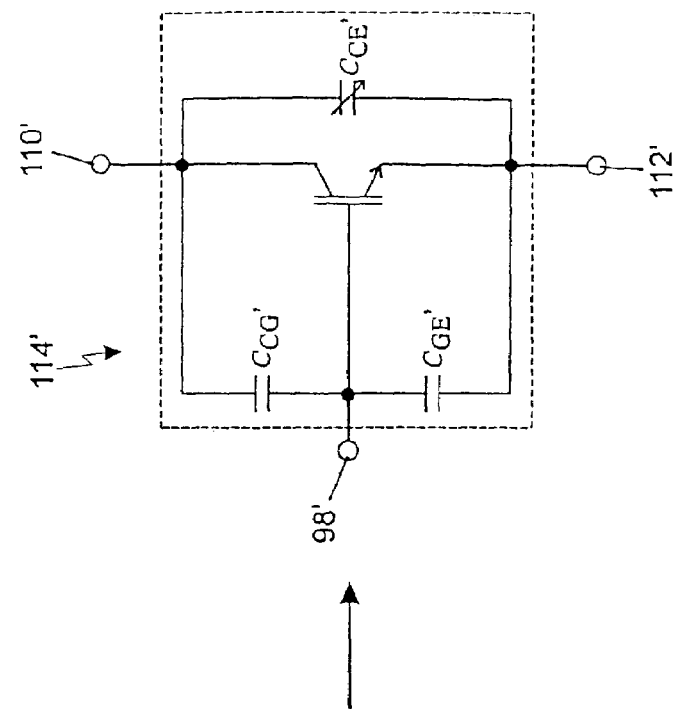
FIG. 8 shows two equivalent circuits for explaining a linearizing process for a non-linear power semiconductor.
Figure 8:
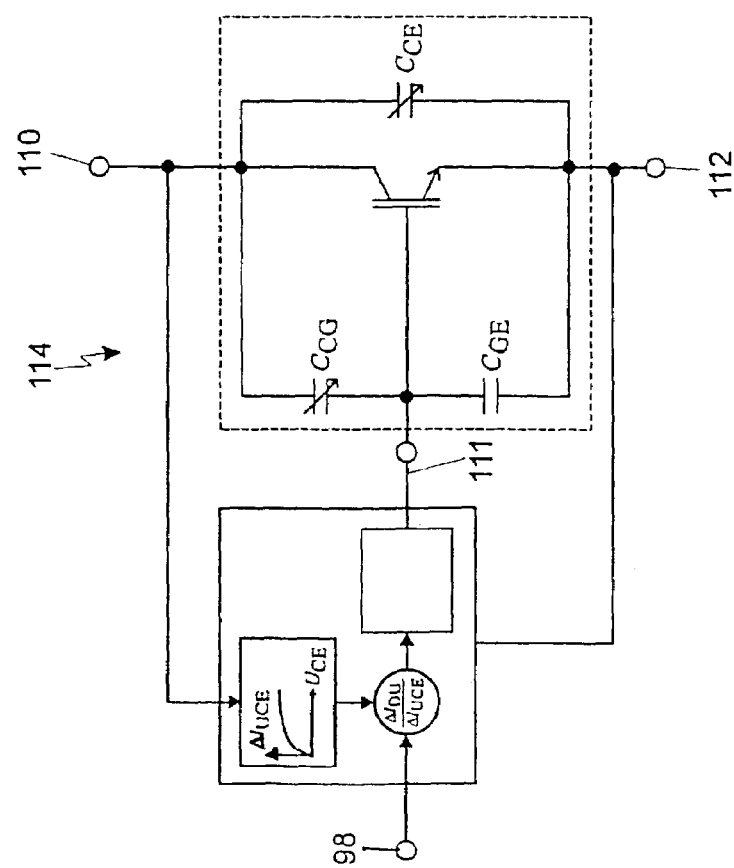

FIG. 8 shows an equivalent circuit for principally explaining the function of linearizing stage 102 (FIG. 6). The block shown in FIG. 8 and having terminals 98 and 111 corresponds to the blocks 102 and 106 in FIG. 6. FIG. 9, insofar, shows a circuit diagram for an embodiment of such a linearizing stage 102 together with dividing stage 106.

Figure 13:
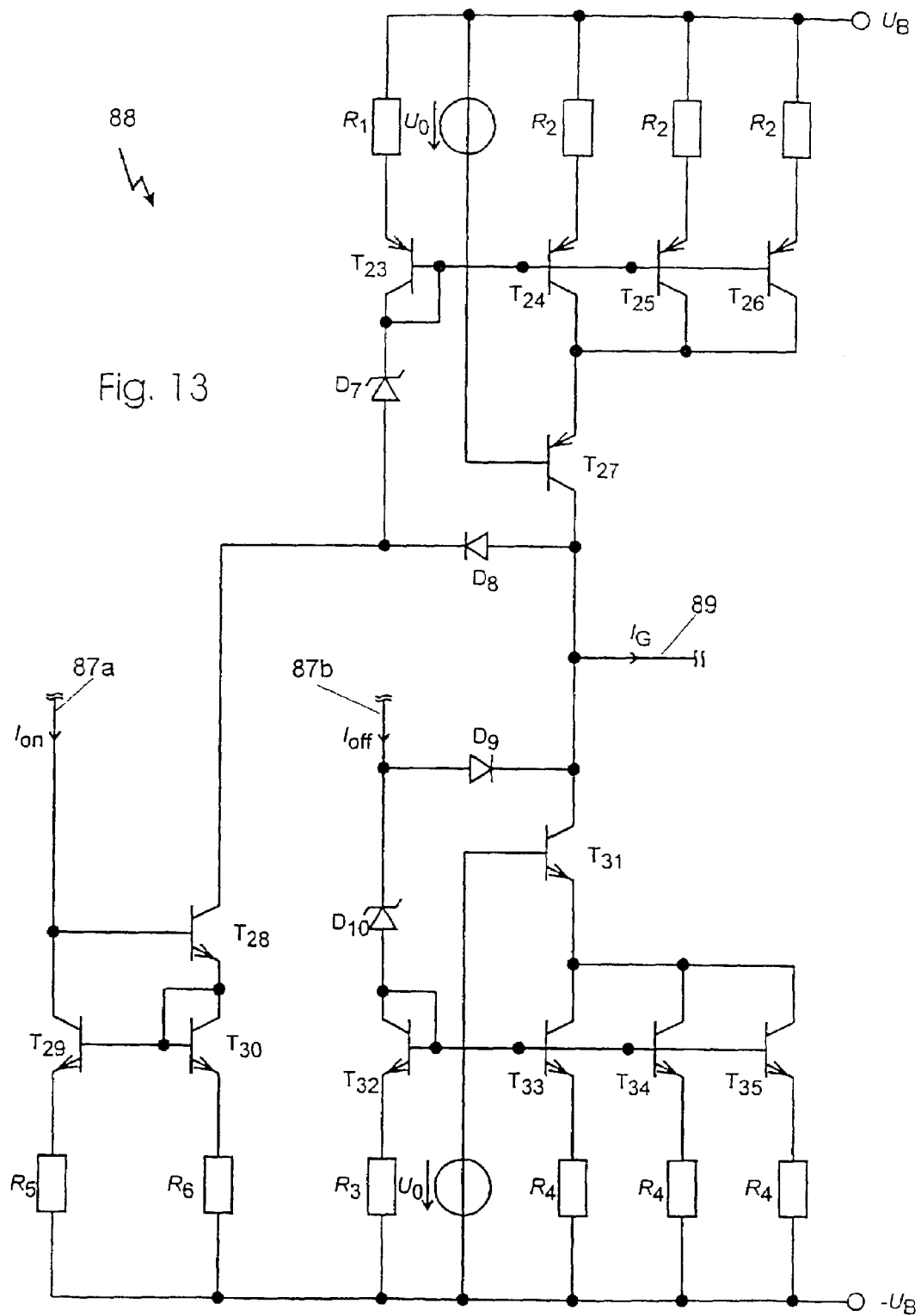
FIG. 13 is a detailed circuit diagram for an embodiment of an output stage as may be used in the circuit of FIG. 4.

In FIG. 13 reference numerals 110, 111 and 112 indicate the collector-, the gate- and the emitter-terminals of an IGBT 114.

Whereas the left side of FIG. 8 shows the circuitry of IGBT 114 with linearizing stage 102, dividing stage 106 and output stage 88, the right side of FIG. 7 shows an equivalent circuit of the left side in which like elements are designated with like reference numerals, however, with the addition of an apostrophe.

During the voltage transient $dU_{CE}/dt$ the gate-voltage at IGBT 114 remains constant. In the prior art this effect is identified as "Miller-plateau". The entire input current $I_G$ then flows away via capacitor $C_{CG}$ and determines the voltage transient $dU_{CE}/dt$. Capacitance $C_{CG}$ is essentially composed from a barrier capacitance and, hence, depends on the collector-emitter voltage $U_{CE}$. The following equation applies:

$$dU_{CE}/dt = \frac{I_G}{C_{CG}} = k \cdot \sqrt{U_{CE}} \cdot I_G$$

The factor k depends on the type of power transistor used, however, it is relatively independent (<10%) of the temperature and the variation of properties between individual transistors. The voltage transient $dU_{CE}/dt$ depends on the magnitude of input current $I_G$ and not on the input voltage. This, too, is a reason why in contrast to controls according to the prior art in which a voltage source is provided at the output of the driver, the control according to the present invention uses a current output stage 88.

Linearizing stage 102 together with differentiating stage 106 comprise a non-linear circuit. The latter requires the magnitude of the collector-emitter voltage $U_{CE}$ and is subjected to the transfer function:

$$dI_{dU/dt} \sim \Delta I_{dU}/\sqrt{U_{CE}}$$

As already mentioned, the left side of FIG. 8 shows the IGBT 114 with separate linearization, whereas the right side shows an IGBT' modified by linearization, as an equivalent circuit diagram. Modified IGBT 114' has a constant collector-gate capacitance $C_{CG}'$. In view of this capacitance $C_{CG}'$ a constant $dU_{CE}/dt$ is obtained when the gate-current $I_G'$ is likewise constant.

The non-linear circuit for linearizing stage 102 as well as the differentiating stage 106 are preferably configured according to the so-called "translinear principle" described by Gilbert. Further details may be found in an article from Gilbert, Barrie, "Translinear circuits: An historical overview", Boston, Mass., 1996, pages 95 through 118, as well in U.S. Pat. No. 6,104,244 A1.

When utilizing the translinear principle, one has the advantage that the required transfer properties are obtained with a minimum number of components and without using feedbacks (stability safety) and by only processing currents (high cut-off frequency).

Figure 9:
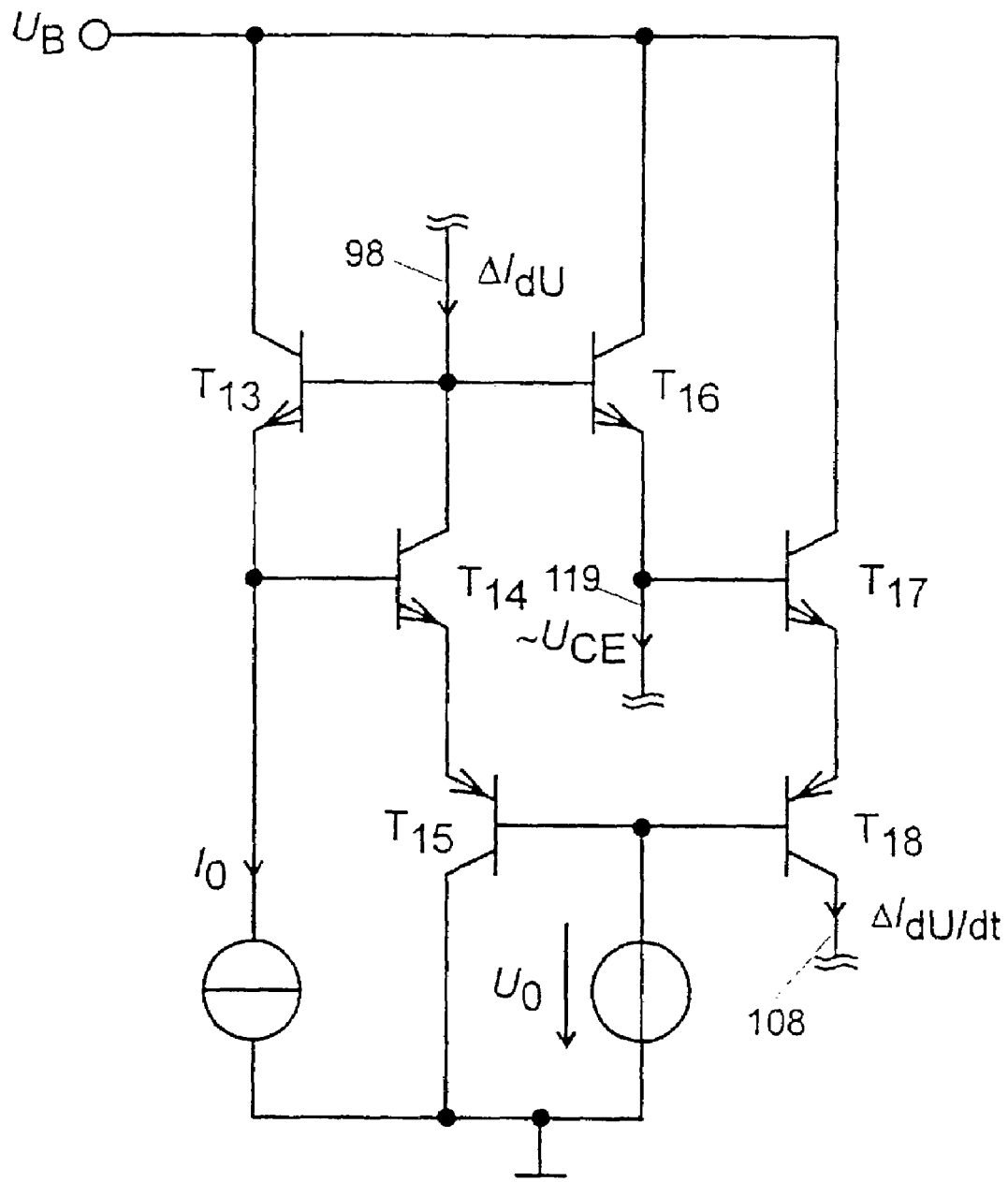
FIG. 9 is a detailed circuit diagram of an embodiment of a liearizing stage as may be used in the circuit of FIG. 8.

The circuit diagram of FIG. 9 shows a transistor $T_{13}$ being connected with its collector to a supply voltage $U_s$. The emitter of transistor $T_{13}$ is connected to a current source through which a mother current $I_0$ flows and which, in turn, is connected to ground. The base-emitter path of transistor $T_{13}$ is bridged by the collector base path of a transistor $T_{14}$ being cascaded towards ground via another transistor $T_{15}$. Still another transistor $T_{16}$ has its collector connected to supply voltage $U_s$ and having its emitter supplied with a signal (current 119) corresponding to the collector-emitter voltage $U_{CE}$. The base of transistor $T_{16}$ is connected to the base of transistor $T_{13}$, the node between these bases, in turn, being connected to line 98.

A line interconnects the emitter of transistor $T_{16}$ with the base of transistor $T_{17}$, the collector of which being connected to supply voltage $U_s$, whereas its emitter is connected to line 108 via a cascaded transistor $T_{18}$. The bases of transistors $T_{15}$ and $T_{10}$ are interconnected. They are on a potential $U_0$ above ground.

The circuit shown in FIG. 9 is designed according to the translinear principle. The input current $\Delta I_{dU}$ is equal to the sum of the currents into the bases of transistors $T_{13}$ and $T_{14}$ and the collector current of transistor $T_4$. Mother current $I_0$ be assumed as being constant. The current 119, as already mentioned, must be considered to be proportional to collector-emitter voltage $U_{CE}$ of the IGBT.

When making the tour around the base-emitter voltages of the six identical transistors $T_{13}$ through $T_{18}$ and if the base currents are neglected, the following equation is obtained:

$$dI_{dU/dt} \sim \sqrt{I_0} \cdot \Delta I_{dU} / \sqrt{U_{CE}}$$

Practice has shown that the deviations from the desired control may be brought down to a value of below 10% also for very low collector-emitter voltages $U_{CE}$ when the non-linear circuit of FIG. 9 is used.

Figure 10:
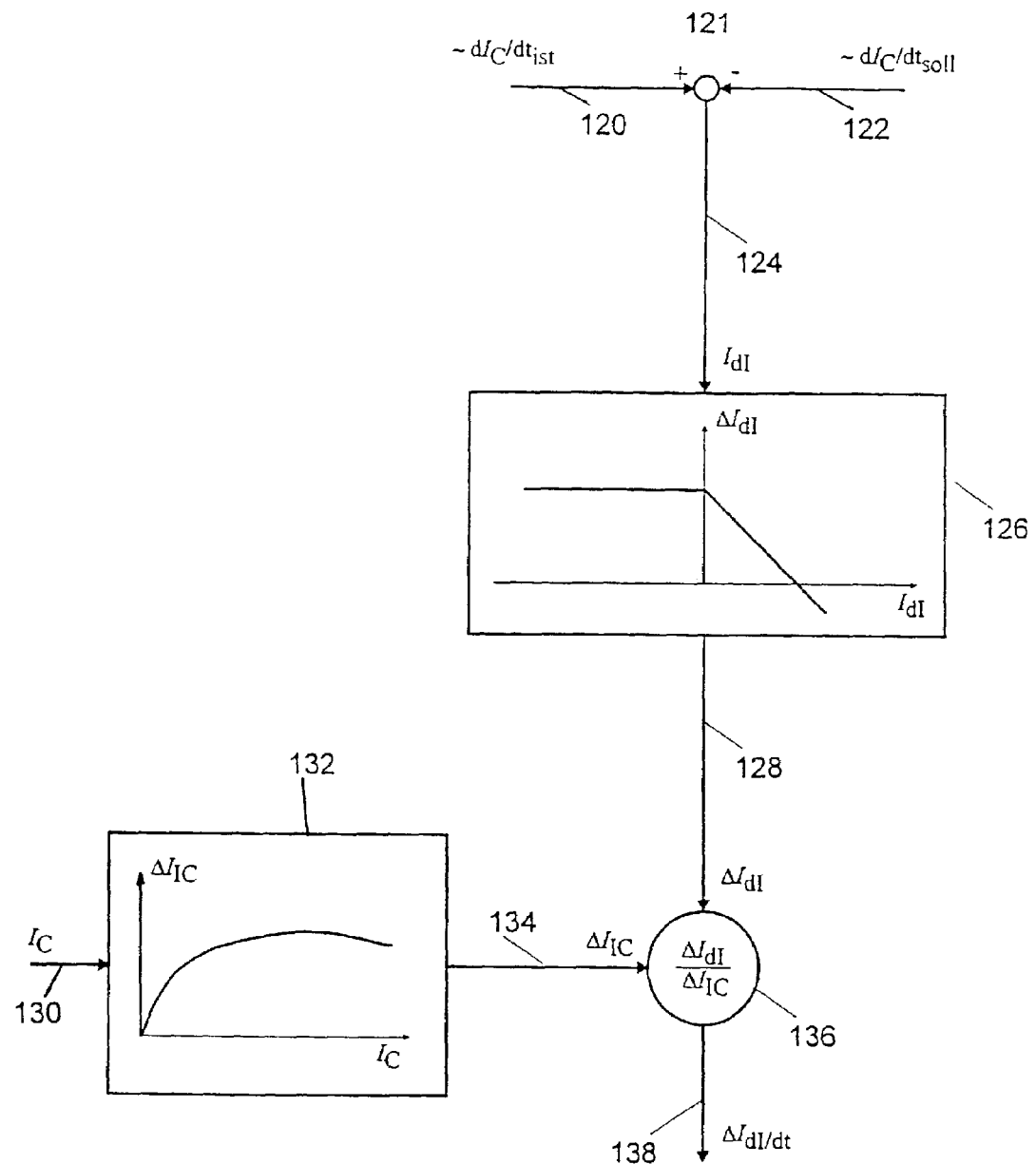
FIG. 10 is a diagram, similar to that of FIG. 6 and showing a circuit for controlling the time function of the collector current $dI_C/dt$.

FIG. 10 in a depiction very similar to that of FIG. 6 shows the principle for a control of the collector current $I_C$.

In that case, too, a subtracting stage 121 is supplied with an actual value via a line 120 and with a desired value via a line 122. At the output of a subtracting stage 121 we have a difference signal configured as a current signal $I_{dI}$ on a line 124. The difference signal is fed to a characteristic curve stage 126.

In contrast to the characteristic curve of characteristic curve stage 96 in FIG. 6, the characteristic curve in the characteristic curve stage 126 of FIG. 10 is configured such that for positive values of input signal $I_{dI}$ the output signal $\Delta I_{dT}$ drops from a constant value down to zero but then, further, drops beyond zero down to further negative values.

Output signal $\Delta I_{dI}$ appears on a line 128 connected to a dividing stage 136.

A signal corresponding to collector current $I_C$ is fed to a linearizing stage 132 via a line 130. Here we have a portion of the linearizing stage that had been designated by NL within the second control stage 82 of FIG. 4. The characteristic curve within linearizing stage 132 is different from the characteristic curve within linearizing stage 102 of FIG. 6 because it is parabolic and opening downwardly.

A current signal $\Delta I_{IC}$ appears at the output of linearizing stage 132 and is likewise fed to dividing stage 136. The control signal $\Delta I_{dI/dt}$ appears at its output, i.e. on a line 138.

The principle of control according to FIG. 10 corresponds to the principle of control according to FIG. 6.

Detection of the actual value for collector current $I_C$ (c.f. block 78 in FIG. 4) may preferably be effected by means of a parasitic inductance $L_P$ (being designated by $L_{E1}$ in FIG. 14 further below).

The non-linear properties of the IGBT in the current transient $dI_C/dt$ during the switching-on and the switching-off process may be described as follows:

$$dI_C/dt \sim \sqrt{I_C} \cdot I_G$$

Analogously to the $dU_{CE}/dt$ control stages 132 and 136 are used, the transfer function of which having an identical structure. It is mandatory that:

$$\Delta I_{dI/dt} \sim \Delta I_{dI} / \sqrt{I_C}$$

The non-linear circuit for that transfer function should likewise be realized according to the above-mentioned translinear principle according to Gilbert.

Experimental results have shown that when the $dI_C/dt$ control is used, the excess voltage during the switching-off process, being composed from the product of $dI_C/dt$ and the entire parasitic inductance within the intermediate circuit, may be reduced from 30% to less than 5%. Therefore, an additional functional block effecting an excess voltage limitation is not necessary in these cases.

Figure 11:
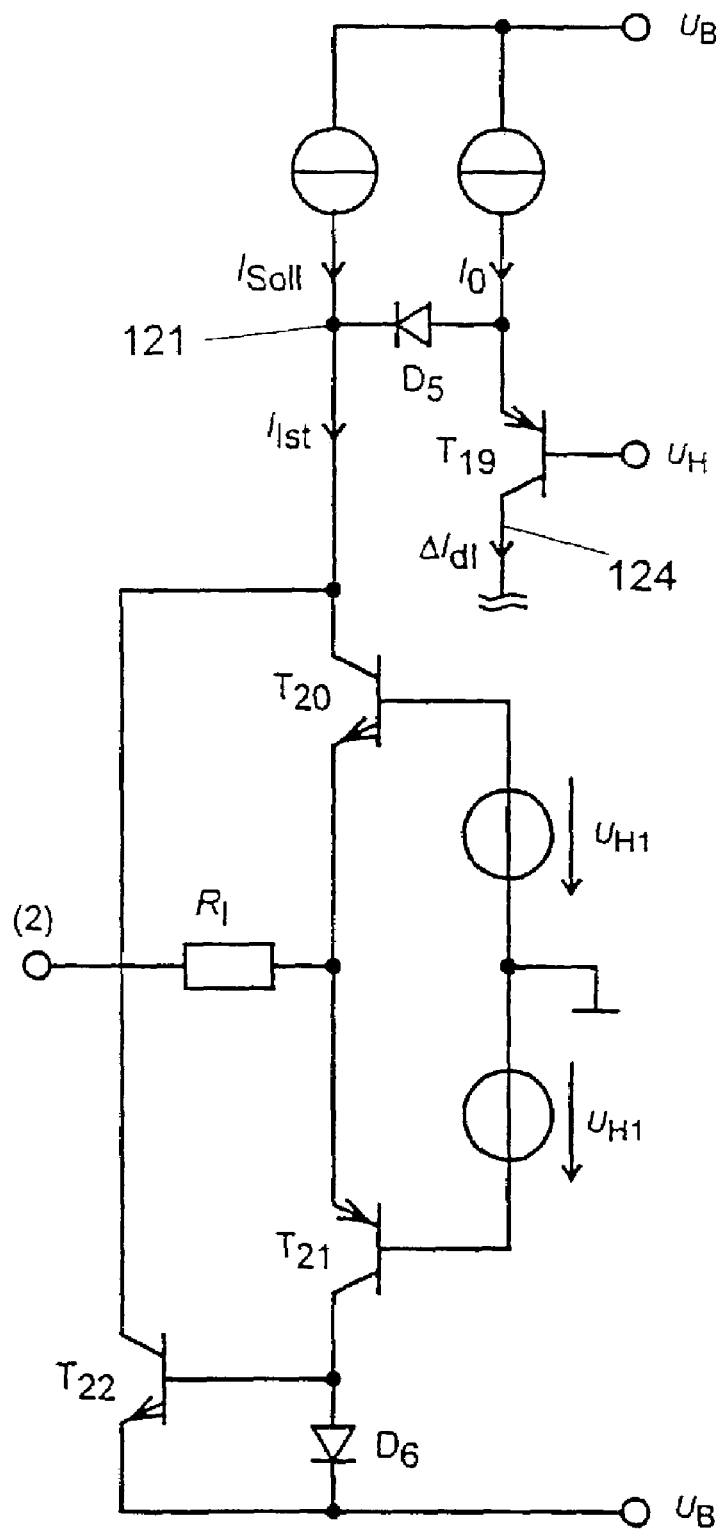
FIG. 11 is a detailed circuit diagram similar to that of FIG. 7, however for a control circuit as may be used in the circuit of FIG. 10.

FIG. 11 shows a practical partial embodiment of the structure shown in FIG. 10 (cf. the practical embodiment of FIG. 7 for the control structure of FIG. 6).

Figure 14:
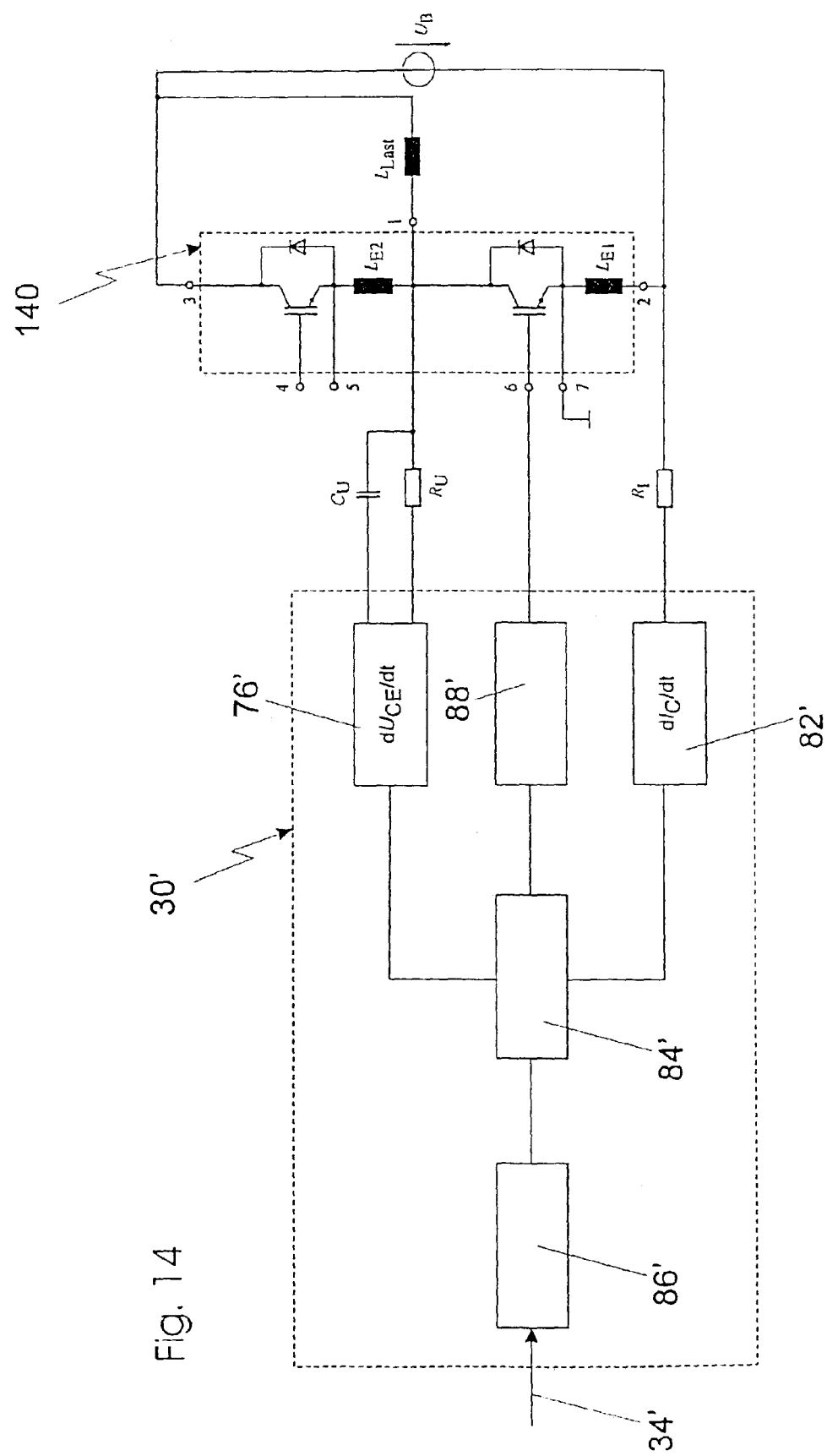
FIG. 14 is another circuit, similar to that of FIG. 2A showing a drive circuit for an IGBT.

In the circuit of FIG. 11 the voltage drop at the parasitic inductance is detected at the terminals indicated with (2) and (7) in FIG. 14. Terminal (2) is shown in FIG. 11. The voltage drop is converted into a current by means of a resistor $R_I$ which, when the voltage is positive, is converted via transistors $T_{21}$ and $T_{22}$ as well as via a diode $D_6$, whereas for a negative voltage it is converted via a transistor $T_{20}$ into a current $I_{ist}$. The current $I_{soll}$ is subtracted therefrom. When the current difference is above zero, it flows at the node of the circuit, corresponding to subtracting stage 121, further via diode $D_5$ and reduces mother current $I_0$ and, consequently, current $\Delta I_{dI}$ which, via a line 124, is transferred to dividing stage 136.

Figure 12:
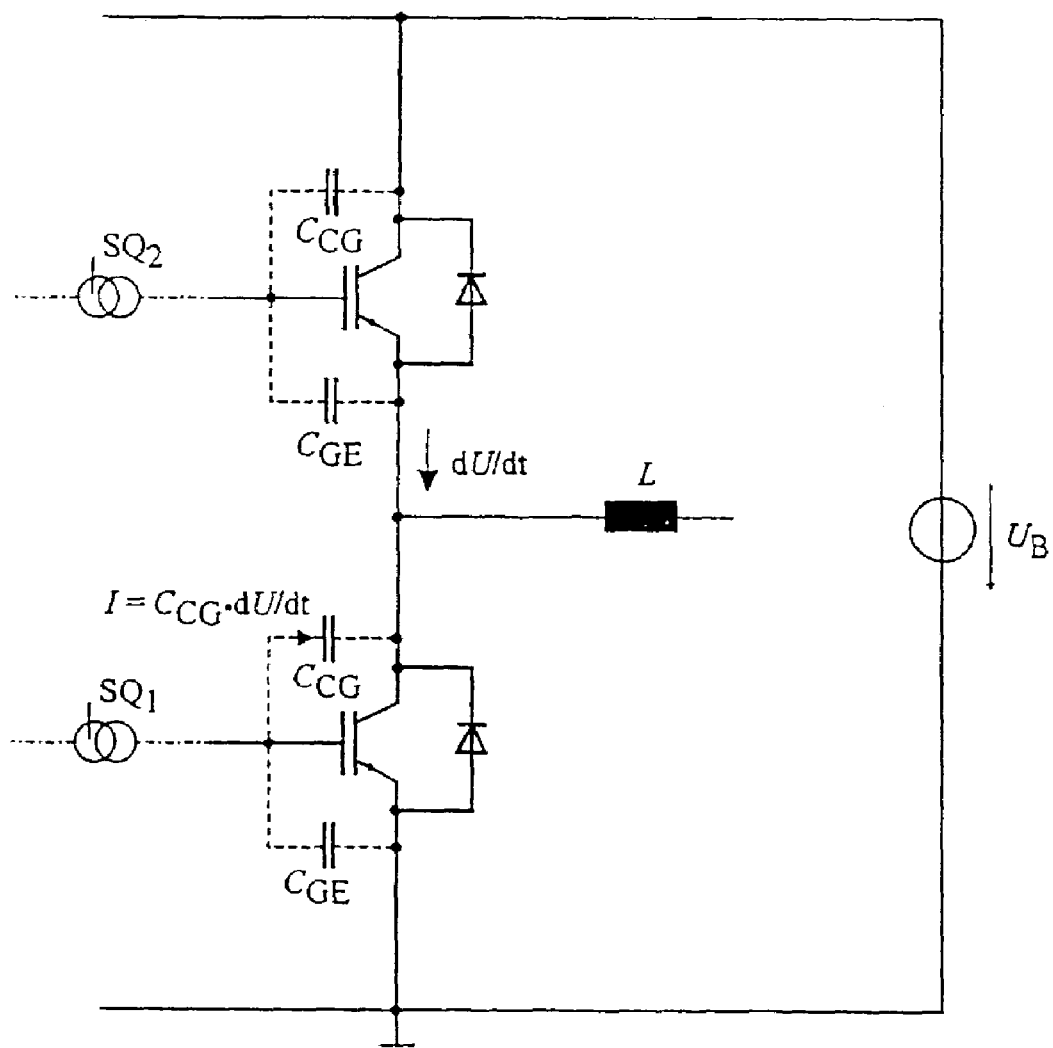
FIG. 12 is a wiring diagram for explaining potential malfunctions when switching two series-connected power semiconductors under inductive load.

FIG. 12 illustrates that a problem may occur when two power transistors are connected in series and an inductive load L is applied to the center terminal between the two power semiconductors.

In the circuit of FIG. 12 it be assumed that the lower power semiconductor be controlled at its input by a current source $SQ_1$ which may correspond to a current output stage. In that event a current flows via capacitance $C_{CG}$ between the collector and the gate of this power semiconductor with the consequence that a voltage rise dU/dt appears at the terminal of the inductive load L. This voltage rise dU/dt may become effective with respect to the capacitance $C_{GE}$ between the gate and the emitter of the upper power semiconductor provided that the latter is also controlled from a current source $SQ_2$. This is because an undesired switching may be effected with the upper power semiconductor that should be in a non-switching stationary state.

In order to avoid this undesired effect, the present invention provides for an output stage which only acts as a current output stage during the switching process, i.e. in the course of the transient, whereas it acts as a voltage output stage in the absence of a switching process.

FIG. 13 shows a practical embodiment of a current output stage 88.

In contrast to output stages of the prior art with low-impedance output, the power output stage 88 according to the invention has the essential advantage that the stability of the control circuit is increased and that additional component (cf. FIGS. 1B and 1C) between the output of driver 30 and the control terminal of the power transistor may be deleted.

In the embodiment of FIG. 13 an output stage 88 is shown having a current amplification of between 15 and 20. Output stage 88 comprises current inputs $I_{on}$ and $I_{off}$ according to the inputs 87a and 87b of output stage 88 from FIG. 4. Further, it comprises a current output $I_G$ corresponding to the output 89 in FIG. 4.

Within the circuitry of FIG. 13 transistors $T_{23}$ through $T_{26}$ as well as $T_{32}$ through $T_{35}$ operate as a so-called "Widlar" current source. In order to obtain an acceptable compromise between cut-off frequency and linearity, not more than three output transistors should be used in a current mirror. The resistance ratio $R_1/R_2$ and $R_3/R_4$ should not exceed 6. In order to eliminate the Miller-effect, transistors $T_{27}$ and $T_{31}$ are superimposed to output stage transistors $T_{24}$ through $T_{26}$ and $T_{33}$ through $T_{35}$, respectively, in a common-base circuit. Diodes $D_7$ through $D_{10}$ prevent that transistors $T_{27}$ through $T_{31}$ are saturated.

The cut-off frequency of output stage 88 may be increased for the switching-on process of the IGBT, by deleting transistor $T_{26}$ and corresponding resistor $R_2$. The overall amplification of output stage 88 may then be corrected via the resistance ratio $R_5/R_6$. The critical point, however, is that the dissipated power of transistor $T_{28}$ may quickly exceed the allowed limit.

Finally, FIG. 14 shows a further practical embodiment of an inventive arrangement shown as a block diagram.

One can see driver 30' corresponding essentially to driver 30 according to the preceding description. As a consequence, it comprises a first control stage 76', a second control stage 82', a sequence control 84' as well as an output stage 88'.

FIG. 14, further, illustrates how the various open-loop and close-loop control stages 76' and 82' obtain their respective input signals. For example, first control stage 76' is connected via a capacity $C_U$ to the emitter of two IGBTs integrated into a common IGBT module 140, such that the capacity $C_U$ generates a derivative in time of the collector-emitter voltage $U_{CE}$ to which it is exposed. Voltage $U_{CE}$ itself is fed to control stage 76' via a resistor $R_U$.

In a corresponding manner, second control stage 82' receives its input signal via a resistor $R_I$ being connected to the emitter of the lower IGBT.

A typical application of IGBT module 140 is in connection with an inverter for a motor control. It comprises at least two IGBTs switched as a half bridge or six such IGBTs with corresponding free-wheeling diodes as a full bridge. Besides the three main terminals "intermediate circuit" (terminal 3), "motor" (terminal 1) and "ground" (terminal 2) there are four terminals (terminals 4 through 7) for connecting the two required drivers. The voltages $U_{LE1}$ and $U_{LE2}$ that can be detected at the prevailing emitter (1 or 2) and auxiliary emitter (5 or 7) are proportional to the derivative of the collector current and are utilized for detecting the actual value. These signals may, therefore, be utilized as input signals for the circuit of FIG. 11, for example. Within the drive circuit the voltages $U_{LE1}$ and $U_{LE2}$ are directly converted into the current $I_{ist}$ at the input.

The circuitry of driver 30 needs to be supplied only with one positive voltage source. The negative supply voltage may be realized by means of switched capacitors. Therefore, one would connect the high-side driver according to the bootstrap method in order to avoid high voltage technology. This procedure belongs to the prior art of voltage supply for high-side drivers within inverters and, hence, need not be explained again in the present context.

The invention claimed is:

1. A method of switching a power semiconductor, wherein during a switching operation of said power semiconductor,
   a) a voltage ($U_{CE}$; $U_{DS}$) across said power semiconductor as well as a current ($I_C$; $I_D$) flowing through said power semiconductor are measured,
   b) a time function ($dU_{CE}/dt$; $dU_{DS}/dt$) of said voltage ($U_{CE}$; $U_{DS}$) as well as a time function ($dI_C/dt$; $dI_D/dt$) of said current ($I_C$; $I_D$) are controlled, and
   c) said control of said voltage time function ($dU_{CE}/dt$; $dU_{DS}/dt$) and said control of said current time function ($dI_C/dt$; $dI_D/dt$) are effected essentially one after the other,
   wherein, further,
   d) for controlling said voltage time function ($dU_{CE}/dt$; $dU_{DS}/dt$),
      a first signal ($I_{soll}$) corresponding to a desired value ([$dU_{CE}/dt$]; [$dU_{DS}/dt$]) of said voltage time function ($dU_{CE}/dt$; $dU_{DS}/dt$) and a second signal ($I_{ist}$) corresponding to an actual value ($dU_{CE}/dt$; $dU_{DS}/dt$) of said voltage time function ($dU_{CE}/dt$; $dU_{DS}/dt$) are generated,
      said first signal ($I_{soll}$) and said second signal ($I_{ist}$) are subtracted one from the other,
      a first difference signal ($I_{ist}-I_{soll}$) between said first and said second signals ($I_{ist}$, $I_{soll}$) is converted into a first control signal ($\Delta U_{dU}$), and
   e) for controlling said current time function ($dI_C/dt$; $dI_D/dt$),
      a third signal ($I_{soll}$) corresponding to a desired value ([$dI_C/dt$]; [$dI_D/dt$]) of said current time function ($dI_C/dt$; $dI_D/dt$) and a fourth signal ($I_{ist}$) corresponding to an actual value ($dI_C/dt$; $dI_D/dt$) of said current time function ($dI_C/dt$; $dI_D/dt$) are generated,
      said third signal ($I_{soll}$) and said fourth signal ($I_{ist}$) are subtracted one from the other,
      a second difference signal ($I_{ist}-I_{soll}$) between said third and said fourth signals ($I_{ist}$, $I_{soll}$) is converted into a second control signal ($\Delta I_{dI}$).

2. The method of claim 1, wherein any of said difference signals is compared with a reference signal, and if said difference signal is above said reference signal, said difference signal is processed as said control signal, whereas if said difference signal is below said reference signal, a zero signal is processed as said control signal.

3. The method of claim 1, wherein said voltage time function is a first derivative of said voltage and said current time function is a first derivative of said current.

4. The method of claim 1, wherein during a switching-on operation said current time function is controlled first and said voltage time function is controlled second.

5. The method of claim 4, wherein a transition from said control of said current time function to said control of said voltage time function is effected essentially when said current reaches a maximum value.

6. The method of claim 4, wherein a transition from said control of said current time function to said control of said voltage time function is effected essentially when said current time function drops by a predetermined amount.

7. The method of claim 4, wherein a transition from said control of said current time function to said control of said voltage time function is effected essentially when said voltage drops by a predetermined amount.

8. The method of claim 4, wherein a transition from said control of said current time function to said control of said voltage time function is effected essentially when said said voltage time function drops by a predetermined amount.

9. The method of claim 8 wherein a transition from said control of said current time function to said control of said voltage time function is effected essentially when a first derivative of a collector-emitter voltage exceeds a first positive predetermined threshold value.

10. The method of claim 4, wherein said power semiconductor is configured as an IGBT, and a transition from said control of said current time function to said control of said voltage time function is effected essentially when a gate-emitter voltage of said IGBT reaches a predetermined value.

11. The method of claim 4, wherein said power semiconductor is configured as an IGBT, and a transition from said control of said current time function to said control of said voltage time function is effected essentially when a gate-emitter voltage time function of said IGBT drops by a predetermined amount.

12. The method of claim 4, wherein said power semiconductor is configured as a MOS-FET, and a transition from said control of said current time function to said control of said voltage time function is effected essentially when a gate-source voltage of said MOS-FET reaches a predetermined value.

13. The method of claim 4, wherein said power semiconductor is configured as a MOS-FET, and a transition from said control of said current time function to said control of said voltage time function is effected essentially when a gate-source voltage time function drops by a predetermined amount.

14. The method of claim 1, wherein during a switching-off operation said voltage time function is controlled first and said current time function is controlled second.

15. The method of claim 14, wherein a transition from said control of said voltage time function to said control of said current time function is effected essentially when said voltage reaches a predetermined value.

16. The method of claim 14, wherein a transition from said control of said voltage time function to said control of said current time function is effected essentially when said voltage time function drops by a predetermined amount.

17. The method of claim 14, wherein a transition from said control of said voltage time function to said control of said current time function is effected essentially when said current drops by a predetermined amount.

18. The method of claim 14, wherein a transition from said control of said voltage time function to said control of said current time function is effected essentially when an absolute value of said current time function drops by a predetermined amount.

19. The method of claim 18, wherein a transition from said control of said voltage time function to said control of said current time function is effected essentially when a first derivative of a collector current falls below a predetermined negative threshold value.

20. The method of claim 18, wherein a transition from said control of said voltage time function to said control of said current time function is effected essentially when an absolute value of a first derivative of a collector current exceeds a predetermined positive threshold value.

21. The method of claim 14, wherein said power semiconductor is configured as an IGBT, and a transition from said control of said voltage time function to said control of said current time function is effected essentially when a gate-emitter voltage of said IGBT reaches a predetermined value.

22. The method of claim 14, wherein said power semiconductor is configured as an IGBT and a first derivative of a gate-emitter voltage of said IGBT first assumes a negative value, then an essentially lower value and, finally drops below a predetermined value, a transition from said control of said voltage time function to said control of said current time function being effected essentially when said gate-emitter voltage drops below said predetermined value.

23. The method of claim 14, wherein said power semiconductor is configured as a MOS-FET, and a transition from said control of said voltage time function to said control of said current time function is effected essentially when a gate-source voltage of said MOS-FET reaches a predetermined value.

24. The method of claim 14, wherein said power semiconductor is configured as a MOS-FET and a first derivative of a gate-source voltage of said MOS-FET first assumes a negative value, then an essentially lower value and, finally drops below a predetermined value, a transition from said control of said voltage time function to said control of said current time function being effected essentially when said gate-source voltage drops below said predetermined value.

25. The method of claim 1, wherein said control signal is transformed non-linearly.

26. The method of claim 1, wherein said voltage is limited to a predetermined threshold value.

27. The method of claim 1, wherein said current is limited to a predetermined threshold value when said power semiconductor is in a switched-on state.

28. The method of claim 1, wherein said power semiconductor is switched off when said current exceeds a predetermined value.

29. The method of claim 1, wherein said power semiconductor is inputted by an output stage, said output stage being operated as a power output stage, at least temporarily.

30. The method of claim 29, wherein during a switching operation of said power semiconductor said output stage is operated as a current output stage.

31. The method of claim 29, wherein in the absence of a switching operation of said power semiconductor said output stage is operated as a voltage output stage.

32. The method of claim 30, wherein during a switching operation said power semiconductor is switched reciprocally between two fixed states by means of said current output stage via a controlled input current.

33. The method of claim 31, wherein during a transition to a switched-off state said power semiconductor is inputted from said current output stage with low impedance and with a fixed voltage.

34. The method of claim 33, wherein said current output stage changes from a high-impedance state to a low-impedance state with a fixed output voltage, essentially when said current approaches a minimum value by a predetermined amount.

35. The method of claim 33, wherein said current output stage changes from a high-impedance state to a low-impedance state with a fixed output voltage, essentially when an absolute value of said current time function drops by a predetermined amount.

36. The method of claim 33, wherein said power semiconductor is configured as an IGBT, and said current output stage changes from a high-impedance state to a low-impedance state with a fixed output voltage, essentially when a gate-emitter voltage of said IGBT drops by a predetermined amount.

37. The method of claim 33, wherein said power semiconductor is configured as a MOS-FET, and said current output stage changes from a high-impedance state to a low-impedance state with a fixed output voltage, essentially when a drain-source voltage of said MOS-FET drops by a predetermined amount.

38. The method of claim 33, wherein during a transition to a switched-on state said power semiconductor is inputted from said current output stage with low impedance and with a fixed voltage.

39. The method of claim 38, wherein said current output stage changes from a high-impedance state to a low-impedance state with a fixed output voltage, essentially when said voltage approaches a minimum value by a predetermined amount.

40. The method of claim 38, wherein said current output stage changes from a high-impedance state to a low-impedance state with a fixed output voltage, essentially when an absolute value of said voltage time function drops by a predetermined amount.

41. The method of claim 38, wherein said power semiconductor is configured as an IGBT, and said current output stage changes from a high-impedance state to a low-impedance state with a fixed output voltage, essentially when a gate-emitter voltage of said IGBT rises by a predetermined amount.

42. The method of claim 38, wherein said power semiconductor is configured as a MOS-FET, and said current output stage changes from a high-impedance state to a low-impedance state with a fixed output voltage, essentially when a gate-source voltage of said MOS-FET rises by a predetermined amount.

43. A method of switching a power semiconductor, wherein during a switching operation of said power semiconductor,
  a) a voltage ($U_{CE}$; $U_{DS}$) across said power semiconductor as well as a current ($I_C$; $I_D$) flowing through said power semiconductor are measured,
  b) a voltage time function ($dU_{CE}/dt$; $dU_{DS}/dt$) as well as a current time function ($dI_C/dt$; $dI_D/dt$) are controlled, and
  c) said control of said voltage time function ($dU_{CE}/dt$; $dU_{DS}/dt$) and said control of said current time function ($dI_C/dt$; $dI_D/dt$) are effected essentially one after the other,
  wherein, further,
  d) for controlling said voltage time function ($dU_{CE}/dt$; $dU_{DS}/dt$),
    a first signal ($I_{soll}$) corresponding to a desired value ($[dU_{CE}/dt]$; $[dU_{DS}/dt]$) of said voltage time function ($dU_{CE}/dt$; $dU_{DS}/dt$) and a second signal ($I_{ist}$) corresponding to an actual value ($dU_{CE}/dt$; $dU_{DS}/dt$) of said voltage time function ($dU_{CE}/dt$; $dU_{DS}/dt$) are generated,
    said first signal ($I_{soll}$) and said second signal ($I_{ist}$) are subtracted one from the other,
    a first difference signal ($I_{ist}-I_{soll}$) between said first and said second signals ($I_{ist}$, $I_{soll}$) is compared with a first reference signal (0), and
    if said first difference signal ($I_{ist}-I_{soll}$) is above said first reference value (0), said first difference signal ($I_{ist}-I_{soll}$) is processed as a first control signal ($\Delta U_{dU}$), whereas
    if said first difference signal ($I_{ist}-I_{soll}$) is below said first reference signal (0), a zero signal is processed as said first control signal ($\Delta U_{dU}$), and
  e) for controlling said current time function ($dI_C/dt$; $dI_D/dt$),
    a third signal ($I_{soll}$) corresponding to a nominal value ($[dI_C/dt]$; $[dI_D/dt]$) of said current time function ($dI_C/dt$; $dI_D/dt$) and a fourth signal ($I_{ist}$) corresponding to an actual value ($dI_C/dt$; $dI_D/dt$) of said current time function ($dI_C/dt$; $dI_D/dt$) are generated,
    said third signal ($I_{soll}$) and said fourth signal ($I_{ist}$) are subtracted one from the other,
    a second difference signal ($I_{ist}-I_{soll}$) between said third and said fourth signals ($I_{ist}$, $I_{soll}$) is compared with a second reference signal (0), and
    if said second difference signal ($I_{ist}-I_{soll}$) is above said second reference value (0), said second difference signal ($I_{ist}-I_{soll}$) is processed as a second control signal ($\Delta I_{dI}$), whereas
    if said second difference signal ($I_{ist}-I_{soll}$) is below said second reference signal (0), a zero signal is processed as said second control signal ($\Delta I_{dI}$).

44. An apparatus for switching a power semiconductor, comprising:
  a) means for measuring a voltage ($U_{CE}$; $U_{DS}$) across said power semiconductor as well as a current ($I_C$; $I_D$) flowing through said power semiconductor,
  b) driver means for controlling a time function ($dU_{CE}/dt$; $dU_{DS}/dt$) of said voltage ($U_{CE}$; $U_{DS}$) as well as a time function ($dI_C/dt$; $dI_D/dt$) of said current ($I_C$; $I_D$), said controlling of said time functions ($dU_{CE}/dt$, $dI_C/dt$; $dU_{DS}/dt$, $dI_D/dt$) being effected one after the other, wherein said driver means comprises:
    voltage time function ($dU_{CE}/dt$; $dU_{DS}/dt$) control means having
      means for generating a first signal ($I_{soll}$) corresponding to a desired value ($[dU_{CE}/dt]$; $[dU_{DS}/dt]$) of said voltage time function ($dU_{CE}/dt$; $dU_{DS}/dt$) and a second signal ($I_{ist}$) corresponding to an actual value ($dU_{CE}/dt$; $dU_{DS}/dt$) of said voltage time function ($dU_{CE}/dt$; $dU_{DS}/dt$),
      means for subtracting said first signal ($I_{soll}$) and said second signal ($I_{ist}$) one from the other,
      means for converting a first difference signal ($I_{ist}-I_{soll}$) between said first and said second signals ($I_{ist}$, $I_{soll}$) into a first control signal ($\Delta U_{dU}$), and
    current time function ($dI_C/dt$; $dI_D/dt$) control means having
      means for generating a third signal ($I_{soll}$) corresponding to a desired value ($[dI_C/dt]$; $[dI_D/dt]$) of said current time function ($dI_C/dt$; $dI_D/dt$) and a fourth signal ($I_{ist}$) corresponding to an actual value ($dI_C/dt$; $dI_D/dt$) of said current time function ($dI_C/dt$; $dI_D/dt$),
      means for subtracting said third signal ($I_{soll}$) and said fourth signal ($I_{ist}$) one from the other,
      means for converting a second difference signal ($I_{ist}-I_{soll}$) between said third and said fourth signals ($I_{ist}$, $I_{soll}$) into a second control signal ($\Delta I_{dI}$).

45. The apparatus of claim 44, wherein said control means further comprises a sequence controller having:
  a) a first output for switching said power semiconductor on;
  b) a second output for switching said power semiconductor off;

c) a first cross-over switch for feeding to said first and said second output said first control signal and said second control signal, respectively, said first cross-over switch being adapted to be operated by a first switching signal;

d) a second cross-over switch between said first cross-over switch and said first and said second output for connecting said first or said second output with said first cross-over switch, said second cross-over switch being adapted to be operated by a second switching signal.

46. The apparatus of claim 44, wherein said control means further comprises means for comparing any of said difference signals with a reference signal, and means for processing said difference signal as said control signal if said difference signal is above said reference signal, and for processing said difference signal as a zero signal if said difference signal is below said reference signal.

47. The apparatus of claim 44, wherein said voltage time function is a first derivative of said voltage and said current time function is a first derivative of said current.

48. The apparatus of claim 44, wherein during a switching-on operation said sequence controller controls said current time function first and said voltage time function second.

49. The apparatus of claim 44, wherein during a switching-off operation said sequence controller controls said voltage time function first and said current time function second.

50. The apparatus of claim 44, wherein for evaluating said current time function and said voltage time function said driver means comprises differentiating stages for generating a first derivative of said current and of said voltage.

51. The apparatus of claim 44, wherein said driver means comprises control stages having a characteristic curve stage generating for negative input signals a constant output signal and for positive input signals an output signal decreasing from a constant value down to zero and then remaining zero.

52. The apparatus of claim 44, wherein said driver means comprises control stages having a characteristic curve stage generating for negative input signals a constant output signal and for positive input signals an output signal decreasing from a constant value down to zero and then falling further below zero.

53. The apparatus of claim 44, wherein said driver means comprises dividing stages for evaluating said control signals.

54. The apparatus of claim 44, wherein said driver means comprises differentiating stages, followed by subtracting stages, followed by characteristic curve stages, followed by dividing stages.

55. The apparatus of claim 44, wherein said driver means comprises control stages together with linearization stages.

56. The apparatus of claim 55, wherein said linearization stages are configured according to the Gilbert translinear principle.

57. The apparatus of claim 45, wherein said first cross-over-switch is configured by transistors having base electrodes, said base electrodes being clamped together at a fixed potential.

58. An apparatus for switching a power semiconductor, comprising:

a) means for measuring a voltage ($U_{CE}$; $U_{DS}$) across said power semiconductor as well as a current ($I_C$; $I_D$) flowing through said power semiconductor, b) driver means for controlling a time function ($dU_{CE}/dt$; $dU_{DS}/dt$) of said voltage ($U_{CE}$; $U_{DS}$) as well as a time function ($dI_C/dt$; $dI_D/dt$) of said current ($I_C$; $I_D$), said controlling of said time functions ($dU_{CE}/dt$, $dI_C/dt$; $dU_{DS}/dt$, $dI_D/dt$) being effected one after the other, wherein said driver means comprises:

voltage time function ($dU_{CE}/dt$; $dU_{DS}/dt$) control means having means for generating a first signal ($I_{soll}$) corresponding to a desired value ([$dU_{CE}/dt$]; [$dU_{DS}/dt$]) of said voltage time function ($dU_{CE}/dt$; $dU_{DS}/dt$) and a second signal ($I_{ist}$) corresponding to an actual value ($dU_{CE}/dt$; $dU_{DS}/dt$) of said voltage time function ($dU_{CE}/dt$; $dU_{DS}/dt$), means for subtracting said first signal ($I_{soll}$) and said second signal ($I_{ist}$) one from the other, means for converting a first difference signal ($I_{ist}-I_{soll}$) between said first and said second signals ($I_{ist}$, $I_{soll}$) into a first control signal ($\Delta U_{dU}$), current time function ($dI_C/dt$; $dI_D/dt$) control means having means for generating a third signal ($I_{soll}$) corresponding to a desired value ([$dI_C/dt$]; [$dI_D/dt$]) of said current time function ($dI_C/dt$; $dI_D/dt$) and a fourth signal ($I_{ist}$) corresponding to an actual value ($dI_C/dt$; $dI_D/dt$) of said current time function ($dI_C/dt$; $dI_D/dt$), means for subtracting said third signal ($I_{soll}$) and said fourth signal ($I_{ist}$) one from the other, means for converting a second difference signal ($I_{ist}-I_{soll}$) between said third and said fourth signals ($I_{ist}$, $I_{soll}$) into a second control signal ($\Delta I_{dI}$), and means for comparing any of said difference signals with a reference signal, and means for processing said difference signal as said control signal if said difference signal is above said reference signal, and for processing said difference signal as a zero signal if said difference signal is below said reference signal.

59. An induction motor having an inverter for generating from a DC supply voltage a three-phase frequency-variable voltage by switching power semiconductors, said inverter comprising:

a) means for measuring a voltage ($U_{CE}$; $U_{DS}$) across said power semiconductors as well as a current ($I_C$; $I_D$) flowing through said power semiconductors, b) driver means for controlling a time function ($dU_{CE}/dt$; $dU_{DS}/dt$) of said voltage ($U_{CE}$; $U_{DS}$) as well as a time function ($dI_C/dt$; $dI_D/dt$) of said current ($I_C$; $I_D$), said controlling of said time functions ($dU_{CE}/dt$, $dI_C/dt$; $dU_{DS}/dt$, $dI_D/dt$) being effected one after the other, wherein said driver means comprises:

voltage time function ($dU_{CE}/dt$; $dU_{DS}/dt$) control means having means for generating a first signal ($I_{soll}$) corresponding to a desired value ([$dU_{CE}/dt$]; [$dU_{DS}/dt$]) of said voltage time function ($dU_{CE}/dt$; $dU_{DS}/dt$) and a second signal ($I_{ist}$) corresponding to an actual value ($dU_{CE}/dt$; $dU_{DS}/dt$) of said voltage time function ($dU_{CE}/dt$; $dU_{DS}/dt$), means for subtracting said first signal ($I_{soll}$) and said second signal ($I_{ist}$) one from the other, means for converting a first difference signal ($I_{ist}-I_{soll}$) between said first and said second signals ($I_{ist}$, $I_{soll}$) into a first control signal ($\Delta U_{dU}$), and current time function ($dI_C/dt$; $dI_D/dt$) control means having means for generating a third signal ($I_{soll}$) corresponding to a desired value ([$dI_C/dt$]; [$dI_D/dt$]) of said current time function ($dI_C/dt$; $dI_D/dt$) and a fourth signal ($I_{ist}$) corresponding to an actual value ($dI_C/dt$; $dI_D/dt$) of said current time function ($dI_C/dt$; $dI_D/dt$), means for subtracting said third signal ($I_{soll}$) and said fourth signal ($I_{ist}$) one from the other, means for converting a second difference signal ($I_{ist}-I_{soll}$) between said third and said fourth signals ($I_{ist}$, $I_{soll}$) into a second control signal ($\Delta I_{dI}$).

60. An ignition system for internal combustion engines having means for generating from a DC supply voltage a pulsed output ignition voltage by switching power semiconductors, said generating means comprising:
   a) means for measuring a voltage ($U_{CE}$; $U_{DS}$) across said power semiconductors as well as a current ($I_C$; $I_D$) flowing through said power semiconductors,
   b) driver means for controlling a time function ($dU_{CE}/dt$, $dU_{DS}/dt$) of said voltage ($U_{CE}$; $U_{DS}$) as well as a time function ($dI_C/dt$; $dI_D/dt$) of said current ($I_C$; $I_D$), said controlling of said time functions ($dU_{CE}/dt$, $dI_C/dt$; $dU_{DS}/dt$, $dI_D/dt$) being effected one after the other, wherein said driver means comprises:
      voltage time function ($dU_{CE}/dt$; $dU_{DS}/dt$) control means having
         means for generating a first signal ($I_{soll}$) corresponding to a desired value ($[dU_{CE}/dt]$; $[dU_{DS}/dt]$) of said voltage time function ($dU_{CE}/dt$; $dU_{DS}/dt$) and a second signal ($I_{ist}$) corresponding to an actual value ($dU_{CE}/dt$; $dU_{DS}/dt$) of said voltage time function ($dU_{CE}/dt$; $dU_{DS}/dt$),
         means for subtracting said first signal ($I_{soll}$) and said second signal ($I_{ist}$) one from the other,
         means for converting a first difference signal ($I_{ist}-I_{soll}$) between said first and said second signals ($I_{ist}$, $I_{soll}$) into a first control signal ($\Delta U_{dU}$), and
      current time function ($dI_C/dt$; $dI_D/dt$) control means having
         means for generating a third signal ($I_{soll}$) corresponding to a desired value ($[dI_C/dt]$; $[dI_D/dt]$) of said current time function ($dI_C/dt$; $dI_D/dt$) and a fourth signal ($I_{ist}$) corresponding to an actual value ($dI_C/dt$; $dI_D/dt$) of said current time function ($dI_C/dt$; $dI_D/dt$),
         means for subtracting said third signal ($I_{soll}$) and said fourth signal ($I_{ist}$) one from the other,
         means for converting a second difference signal ($I_{ist}-I_{soll}$) between said third and said fourth signals ($I_{ist}$, $I_{soll}$) into a second control signal ($\Delta I_{dI}$).

61. A switched-mode power supply having means for generating from a DC supply voltage a DC output voltage by switching power semiconductors, said generating means comprising:
   a) means for measuring a voltage ($U_{CE}$; $U_{DS}$) across said power semiconductors as well as a current ($I_C$; $I_D$) flowing through said power semiconductors,
   b) driver means for controlling a time function ($dU_{CE}/dt$; $dU_{DS}/dt$) of said voltage ($U_{CE}$; $U_{DS}$) as well as a time function ($dI_C/dt$; $dI_D/dt$) of said current ($I_C$; $I_D$), said controlling of said time functions ($dU_{CE}/dt$, $dI_C/dt$; $dU_{DS}/dt$, $dI_D/dt$) being effected one after the other, wherein said driver means comprises:
      voltage time function ($dU_{CE}/dt$; $dU_{DS}/dt$) control means having
         means for generating a first signal ($I_{soll}$) corresponding to a desired value ($[dU_{CE}/dt]$; $[dU_{DS}/dt]$) of said voltage time function ($dU_{CE}/dt$; $dU_{DS}/dt$) and a second signal ($I_{ist}$) corresponding to an actual value ($dU_{CE}/dt$; $dU_{DS}/dt$) of said voltage time function ($dU_{CE}/dt$; $dU_{DS}/dt$),
         means for subtracting said first signal ($I_{soll}$) and said second signal ($I_{ist}$) one from the other,
         means for converting a first difference signal ($I_{ist}-I_{soll}$) between said first and said second signals ($I_{ist}$, $I_{soll}$) into a first control signal ($\Delta U_{dU}$), and
      current time function ($dI_C/dt$; $dI_D/dt$) control means having
         means for generating a third signal ($I_{soll}$) corresponding to a desired value ($[dI_C/dt]$; $[dI_D/dt]$) of said current time function ($dI_C/dt$; $dI_D/dt$) and a fourth signal ($I_{ist}$) corresponding to an actual value ($dI_C/dt$; $dI_D/dt$) of said current time function ($dI_C/dt$; $dI_D/dt$),
         means for subtracting said third signal ($I_{soll}$) and said fourth signal ($I_{ist}$) one from the other,
         means for converting a second difference signal ($I_{ist}-I_{soll}$) between said third and said fourth signals ($I_{ist}$, $I_{soll}$) into a second control signal ($\Delta I_{dI}$).

62. A power-factor-controller having means for generating from a DC supply voltage a DC output voltage by switching power semiconductors, said generating means comprising:
   a) means for measuring a voltage ($U_{CE}$; $U_{DS}$) across said power semiconductors as well as a current ($I_C$; $I_D$) flowing through said power semiconductors,
   b) driver means for controlling a time function ($dU_{CE}/dt$; $dU_{DS}/dt$) of said voltage ($U_{CE}$; $U_{DS}$) as well as a time function ($dI_C/dt$; $dI_D/dt$) of said current ($I_C$; $I_D$), said controlling of said time functions ($dU_{CE}/dt$, $dI_C/dt$; $dU_{DS}/dt$, $dI_D/dt$) being effected one after the other, wherein said driver means comprises:
      voltage time function ($dU_{CE}/dt$; $dU_{DS}/dt$) control means having
         means for generating a first signal ($I_{soll}$) corresponding to a desired value ($[dU_{CE}/dt]$; $[dU_{DS}/dt]$) of said voltage time function ($dU_{CE}/dt$; $dU_{DS}/dt$) and a second signal ($I_{ist}$) corresponding to an actual value ($dU_{CE}/dt$; $dU_{DS}/dt$) of said voltage time function ($dU_{CE}/dt$; $dU_{DS}/dt$),
         means for subtracting said first signal ($I_{soll}$) and said second signal ($I_{ist}$) one from the other,
         means for converting a first difference signal ($I_{ist}-I_{soll}$) between said first and said second signals ($I_{ist}$, $I_{soll}$) into a first control signal ($\Delta U_{dU}$), and
      current time function ($dI_C/dt$; $dI_D/dt$) control means having
         means for generating a third signal ($I_{soll}$) corresponding to a desired value ($[dI_C/dt]$; $[dI_D/dt]$) of said current time function ($dI_C/dt$; $dI_D/dt$) and a fourth signal ($I_{ist}$) corresponding to an actual value ($dI_C/dt$; $dI_D/dt$) of said current time function ($dI_C/dt$; $dI_D/dt$),
         means for subtracting said third signal ($I_{soll}$) and said fourth signal ($I_{ist}$) one from the other,
         means for converting a second difference signal ($I_{ist}-I_{soll}$) between said third and said fourth signals ($I_{ist}$, $I_{soll}$) into a second control signal ($\Delta I_{dI}$).

* * * * *